(12) United States Patent
Fujise

(10) Patent No.: US 12,302,566 B2
(45) Date of Patent: May 13, 2025

(54) SEMICONDUCTOR MEMORY DEVICE AND METHOD FOR MANUFACTURING THE SAME

(71) Applicant: Kioxia Corporation, Tokyo (JP)

(72) Inventor: Shinya Fujise, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 431 days.

(21) Appl. No.: 17/685,896

(22) Filed: Mar. 3, 2022

(65) Prior Publication Data

US 2023/0061224 A1 Mar. 2, 2023

(30) Foreign Application Priority Data

Aug. 30, 2021 (JP) .................... 2021-140474

(51) Int. Cl.
*H10B 43/27* (2023.01)
(52) U.S. Cl.
CPC .................... *H10B 43/27* (2023.02)
(58) Field of Classification Search
CPC ......... H10B 43/27; H10B 43/10; H10B 43/35
USPC .......................................................... 257/324
See application file for complete search history.

(56) References Cited

U.S. PATENT DOCUMENTS

| | | | | |
|---|---|---|---|---|
| 9,893,080 B2* | 2/2018 | Tsuda | .................. | H10B 43/35 |
| 10,153,296 B2* | 12/2018 | Lida | .................. | H10B 41/35 |
| 10,186,521 B2* | 1/2019 | Fukumoto | .......... | H01L 21/02532 |
| 10,483,207 B2* | 11/2019 | Watarai | ................ | H01L 23/535 |
| 10,629,612 B2* | 4/2020 | Okawa | ................ | H01L 29/7926 |
| 10,651,190 B2 | 5/2020 | Nagashima | | |
| 11,075,213 B2* | 7/2021 | Noda | .................... | H10B 41/20 |
| 2016/0247756 A1* | 8/2016 | Li | .......................... | H10B 41/35 |
| 2017/0263612 A1* | 9/2017 | Yamashita | ............ | H10B 43/40 |
| 2017/0309638 A1* | 10/2017 | Nagumo | .............. | H01L 29/4234 |
| 2018/0040742 A1* | 2/2018 | Matsuo | ................ | H10B 43/35 |
| 2018/0269224 A1* | 9/2018 | Shimizu | ............ | H01L 21/02636 |
| 2018/0277221 A1* | 9/2018 | Minemura | ......... | G11C 16/3459 |
| 2019/0287989 A1* | 9/2019 | Mizutani | ............... | H10B 43/30 |
| 2019/0296034 A1 | 9/2019 | Nagashima | | |
| 2019/0371813 A1* | 12/2019 | Oike | ..................... | H10B 43/10 |
| 2020/0303396 A1* | 9/2020 | Minemura | ............ | G11C 16/24 |
| 2020/0303404 A1* | 9/2020 | Minemura | ............ | G11C 16/10 |

FOREIGN PATENT DOCUMENTS

JP 2019-165134 A 9/2019

\* cited by examiner

*Primary Examiner* — Mohammad M Hoque
(74) *Attorney, Agent, or Firm* — Foley & Lardner LLP

(57) ABSTRACT

According to one embodiment, a semiconductor memory device includes a first stacked body including a first insulating film and a first conductive film alternately stacked in a first direction. A plurality of first columnar bodies extend in a first stacked body in the first direction and include a first semiconductor portion. A second insulating film is disposed on the first stacked body and includes a material different from that of the first insulating film. The first insulating portion is disposed on the second insulating film. When a second direction is a direction in which a first film extends in a plane that intersects the first direction, the first film penetrates the second insulating film in the first direction and extends in the second direction.

7 Claims, 36 Drawing Sheets

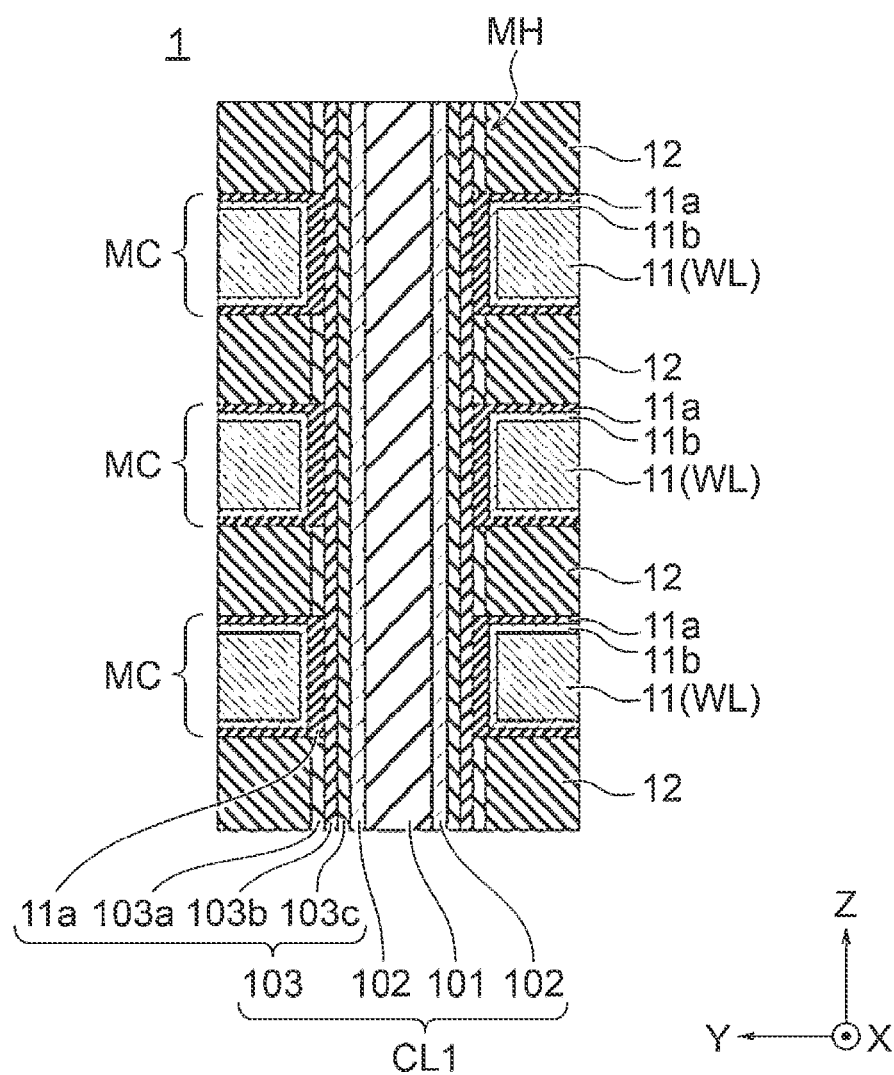

SEMICONDUCTOR MEMORY DEVICE AND METHOD FOR MANUFACTURING THE SAME

CROSS-REFERENCE TO RELATED APPLICATION

This application is based upon and claims the benefit of priority from Japanese Patent Application No. 2021-140474, filed Aug. 30, 2021, the entire contents of which are incorporated herein by reference.

FIELD

Embodiments described herein relate generally to a semiconductor memory device and a method for manufacturing the same.

BACKGROUND

Semiconductor memory device such as a NAND flash memory or the like may include a three-dimensional memory cell array in which a plurality of memory cells are three-dimensionally arranged. A plurality of select gates are provided on an upper portion of the three-dimensional memory cell array to select a memory string. In such a semiconductor memory device, an isolating portion is provided above the three-dimensional memory cell array to electrically isolate the plurality of adjacent select gates.

During a formation of the memory cell array, a replacement process is performed such that, in a stacked body of an insulating film and a sacrificial layer, the sacrificial layer is replaced with a conductive layer. The isolating portion is formed in the memory cell array after this replacement process.

However, in the replacement process, the memory cell array may be inclined due to thermal shrinkage of the conductive layer. There is a concern that the isolating portion formed thereafter is formed at a position deviated from a desired position due to such an inclination of the memory cell array. The misalignment of the isolating portion may cause defects in the select gate.

DESCRIPTION OF THE DRAWINGS

FIG. 2A is a schematic cross-sectional view illustrating an example of a memory cell having a three-dimensional structure.

DETAILED DESCRIPTION

Figure 1A:
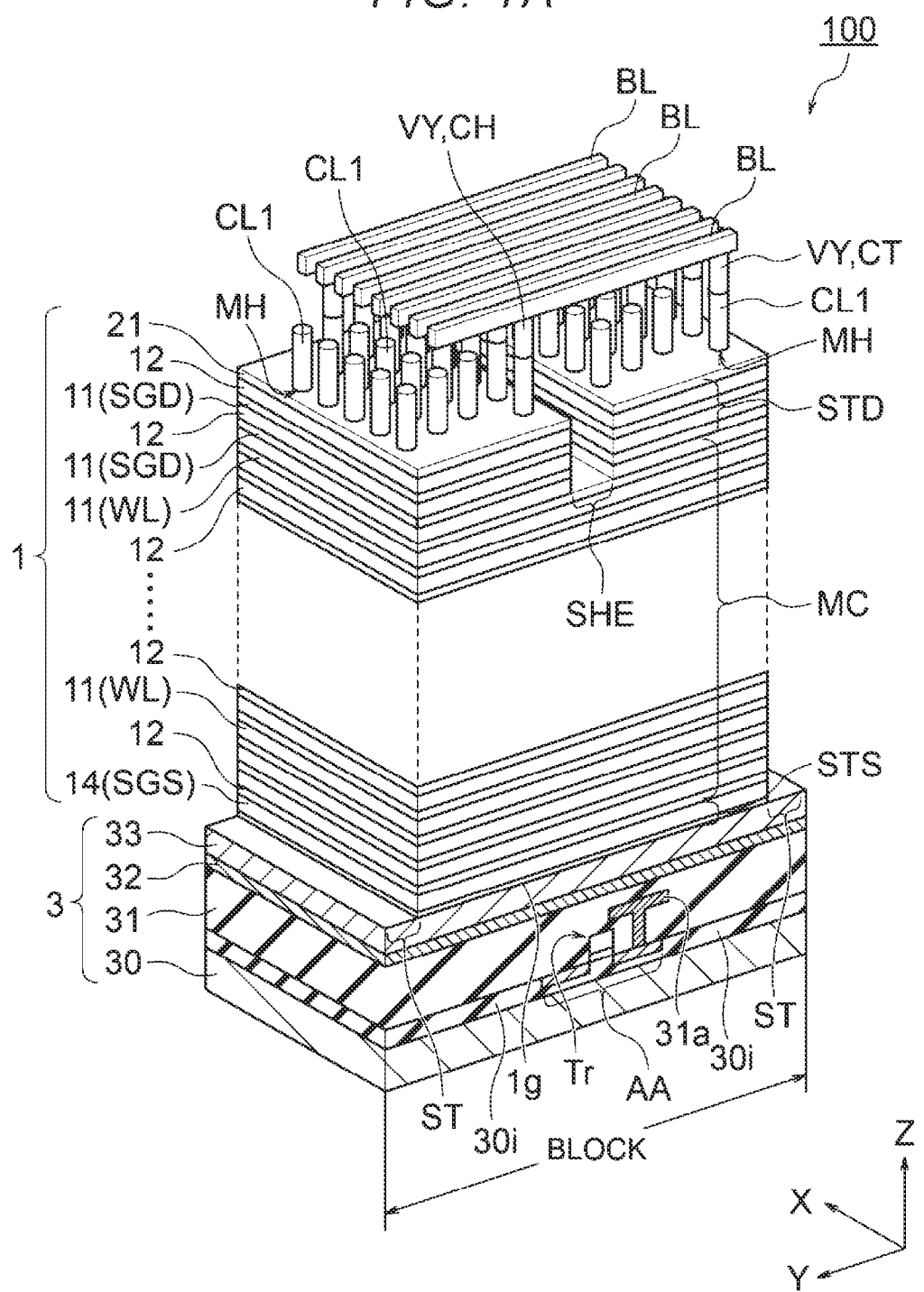
FIG. 1A is a schematic perspective view illustrating an example of a semiconductor memory device according to a first embodiment.

Embodiments provide a semiconductor memory device capable of preventing defects from being generated in a select gate due to an inclination of a memory cell array, and a method for manufacturing the same.

In general, according to one embodiment, a semiconductor memory device includes a first stacked body including a first insulating film and a first conductive film alternately stacked in a first direction. A plurality of first columnar bodies extend in the first stacked body in a first direction and include a first semiconductor portion. A second insulating film is disposed on the first stacked body and includes a material different from that of the first insulating film. The first insulating portion is disposed on the second insulating film. A first film penetrates the second insulating film in the first direction and extends in a second direction that intersects the first direction.

Hereinafter, embodiments will be described with reference to the drawings. The embodiments are not intended to limit the scope of the disclosure. The drawings are schematic or conceptual, and the respective portions are not necessarily drawn to actual scale. Throughout the description and the drawings, the same elements as those already described with respect to the previous drawings are designated by the same reference numerals, and detailed description thereof will be omitted as appropriate.

First Embodiment

Figure 1B:
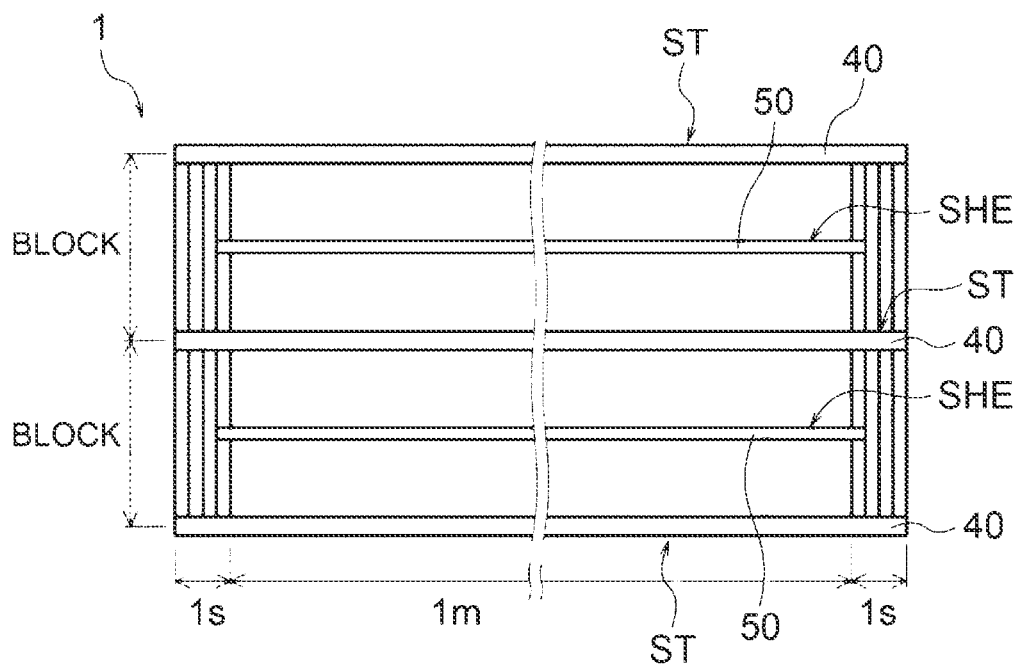
FIG. 1B is a schematic plan view illustrating a first stacked body.
Figure 2B:
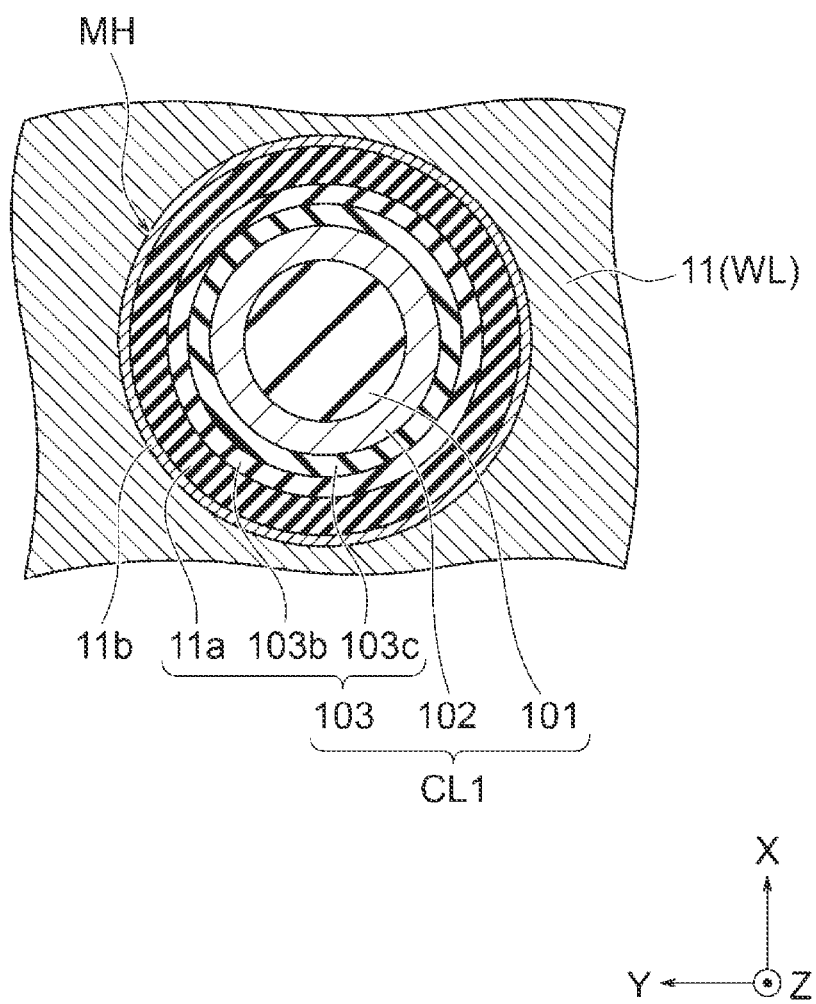
FIG. 2B is a schematic cross-sectional view illustrating an example of the memory cell having a three-dimensional structure.
Figure 3:
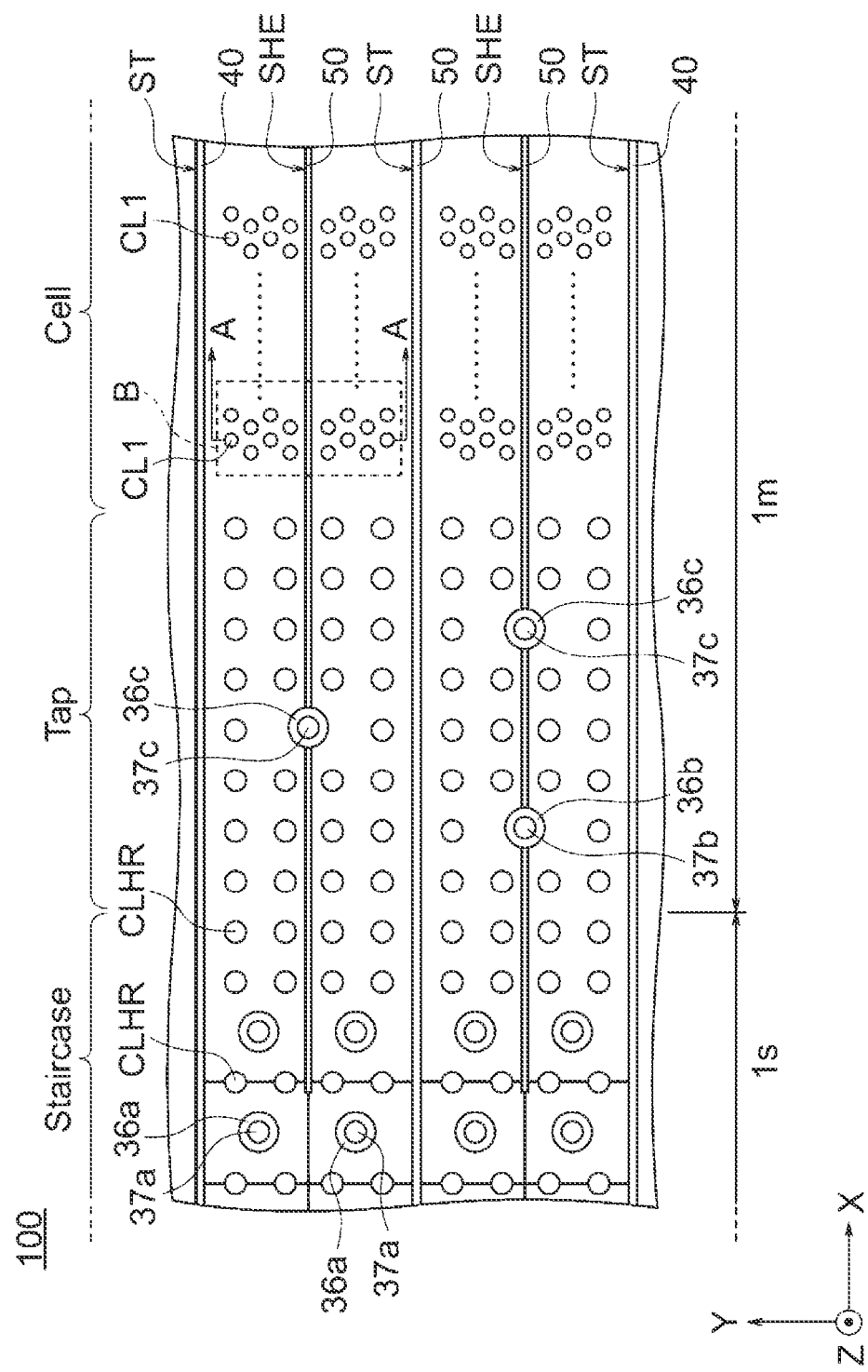
FIG. 3 is a schematic plan view illustrating an example of the semiconductor memory device according to the first embodiment.

FIG. 1A is a schematic perspective view illustrating a semiconductor memory device according to a first embodiment. FIG. 1B is a schematic plan view illustrating a stacked body 1. In the description, the stacking direction of the stacked body 1 is defined as a first direction (Z direction). One direction that intersects, for example, is orthogonal to the first direction is defined as a second direction (X direction). One direction that intersects, for example, is orthogonal to the first and second directions is defined as a third direction (Y direction). A plane that intersects the Z direction is an X-Y plane. FIGS. 2A and 2B are schematic cross-sectional views illustrating a memory cell having a three-dimensional structure, respectively. FIG. 3 is a schematic plan view illustrating a semiconductor memory device 100 according to the first embodiment.

As illustrated in FIGS. 1A to 3, the semiconductor memory device 100 according to the first embodiment is a non-volatile memory including a memory cell having a three-dimensional structure.

The semiconductor memory device 100 includes a base 3, the stacked body 1, a deep slit ST (a plate-shaped portion 40), a shallow slit SHE, and a plurality of columnar bodies CL1.

The base 3 includes a substrate 30, an insulating film 31, a conductive film 32, and a semiconductor portion 33. The insulating film 31 is provided on the substrate 30. The conductive film 32 is provided on the insulating film 31. The semiconductor portion 33 is provided on the conductive film 32. The substrate 30 is a silicon substrate, for example. The conductive type of silicon (Si) is p type, for example. For example, an element isolation area 30i is provided on a surface region of the substrate 30. For example, the element isolation area 30i is an insulating region including a silicon oxide, and defines an active area AA in the surface region of the substrate 30. The active area AA includes source and drain regions of a transistor Tr. The transistor Tr forms a peripheral circuit (Complementary Metal Oxide Semiconductor (CMOS) circuit) of a non-volatile memory. For example, the insulating film 31 includes silicon oxide ($SiO_2$) and insulates the transistor Tr. A wiring 31a is provided in the insulating film 31. The wiring 31a is a wiring that is electrically connected to the transistor Tr. The conductive film 32 includes a conductive metal such as tungsten (W), for example. The semiconductor portion 33 includes silicon, for example. The conductive type of silicon is n type, for example. A portion of the semiconductor portion 33 may include an undoped silicon.

The stacked body 1 is provided above the substrate 30 and is located in the Z direction of the semiconductor portion 33. The stacked body 1 is an example of the first stacked body. The stacked body 1 is configured with alternately stacking a plurality of conductive films 11 and a plurality of insulating films 12 along the Z direction. The conductive films 11 are an example of the first conductive film, and the insulating films 12 are an example of the first insulating film. The conductive films 11 include a conductive metal such as tungsten, for example. The insulating films 12 include a silicon oxide, for example. The insulating films 12 insulate the conductive films 11 from each other. Any number of the conductive films 11 and the insulating films 12 may be stacked. The insulating films 12 may be an air gap, for example. For example, an insulating film 1g is provided between the stacked body 1 and the semiconductor portion 33. The insulating film 1g includes a silicon oxide ($SiO_2$), for example. The insulating film 1g may include a high dielectric material having a higher relative permittivity than the silicon oxide. The high dielectric material is a metal oxide such as a hafnium oxide and the like, for example.

The conductive film 11 includes at least one source-side select gate SGS, a plurality of word lines WL, and at least one drain-side select gate SGD. The source-side select gate SGS is a gate electrode of a source-side select transistor STS. The drain-side select gate SGD is a gate electrode of a drain-side select transistor STD. The source-side select gate SGS is provided in a lower region of the stacked body 1. The drain-side select gate SGD is provided in an upper region of the stacked body 1. The lower region refers to a region on the side of the stacked body 1 close to the base 3, and the upper region refers to a region of the stacked body 1 far from the base 3. The word line WL is provided between the source-side select gate SGS and the drain-side select gate SGD.

Among the plurality of insulating films 12, the thickness in the Z direction of the insulating film 12 that insulates the source-side select gate SGS and the word line WL from each other may be greater than the thickness in the Z direction of the insulating film 12 that insulates the word line WL and the word line WL from each other, for example.

The semiconductor memory device 100 includes a plurality of memory cells MC connected in series between the source-side select gate SGS and the drain-side select gate SGD. The structure in which the source-side select transistor STS, the memory cell MC, and the drain-side select transistor STD are connected in series is called a "memory string" or a "NAND string". The memory string is connected to a bit line BL via contacts CT and VY, for example. The bit line BL is provided above the stacked body 1 and extends in the Y direction.

A guide insulating film 21 is provided on the stacked body 1. The guide insulating film 21 is an example of the second insulating film. The guide insulating film 21 includes a material different from that of the insulating film 12. For example, when the insulating film 12 is a silicon oxide film, the guide insulating film 21 includes a material other than silicon oxide, and includes silicon nitride (SiN) or aluminum oxide ($Al_2O_3$), for example. The guide insulating film 21 will be described below.

A plurality of deep slits ST and a plurality of shallow slits SHE are provided in the stacked body 1, respectively. The deep slit ST penetrates the stacked body 1 from the upper end of the stacked body 1 to the base 3 in the Z direction and extends in the stacked body 1 in the X direction in a plan view seen from the Z direction. The plate-shaped portion 40 is provided in the deep slit ST (FIG. 1B). For example, the plate-shaped portion 40 may include an insulating material such as a silicon oxide film and the like. The plate-shaped portion 40 is an example of the second isolating portion. The plate-shaped portion 40 may include a conductive film electrically connected to the semiconductor portion 33 while being electrically insulated from the stacked body 1 by the insulating film. The shallow slit SHE is provided in the Z direction from the upper end of the stacked body 1 to the middle of the stacked body 1 in an upper-layer portion of the stacked body 1. Further, the shallow slit SHE extends in the X direction in a plan view seen from the Z direction. In the shallow slit SHE, an insulator 50 is provided, for example. The insulator 50 is a silicon oxide film, for example. The insulator 50 is an example of the first film (for example, the isolating portion). The plate-shaped portion 40 and the insulator 50 extend in the X direction substantially parallel to each other in the plane (X-Y plane) (plan view seen from the Z direction) intersecting the Z direction.

As illustrated in FIG. 1B, the stacked body 1 includes a staircase portion 1s and a memory cell array 1m. The staircase portion 1s is provided at an edge of the stacked body 1. The memory cell array 1m is sandwiched between, or surrounded by the staircase portions 1s. The deep slit ST extends through the memory cell array 1m, from the staircase portion 1s on one end of the stacked body 1 to the staircase portion 1s on the other end of the stacked body 1. The shallow slit SHE is provided at least in the memory cell array 1m.

As illustrated in FIG. 3, the memory cell array 1m includes a cell region (Cell) and a tap region (Tap). The staircase portion 1s includes a staircase region (Staircase). For example, the tap region is provided between the cell region and the staircase region. Although not illustrated in FIG. 3, the tap region may be provided between the cell regions, for example. The staircase region is a region where a plurality of wirings 37a are provided. The tap region is a region where wirings 37b and 37c are provided. Each of the wirings 37a to 37c extends in the Z direction, for example. Each of the wirings 37a is electrically connected to the conductive film 11, for example. The wiring 37b is connected to the conductive film 32, for example. The wiring 37c is electrically connected to the wiring 31a, for example.

The portion of the stacked body 1 interposed between the two plate-shaped portions 40 illustrated in FIG. 1B is called a block. For example, the block forms a smallest unit of data erasure. The insulator 50 is provided in the block. The stacked body 1 between the plate-shaped portion 40 and the insulator 50 is called a finger. The drain-side select gate SGD is divided by each finger. Therefore, when data is written and read, the drain-side select gate SGD can allow one finger in the block to be selected.

As illustrated in FIG. 1A, each of the plurality of columnar bodies CL1 is provided in a memory hole MH provided in the stacked body 1. The columnar bodies CL1 are an example of the first columnar body. Each columnar body CL1 penetrates the stacked body 1 from the upper end of the stacked body 1 along the Z direction, through the stacked body 1 down to the semiconductor portion 33. As illustrated in FIG. 2A, the plurality of columnar bodies CL1 each include a core layer 101, a semiconductor body 102, and a memory film 103. The semiconductor body 102 is an example of the first semiconductor portion, and the memory film 103 is an example of the first insulator portion. The semiconductor body 102 is electrically connected to the semiconductor portion 33. The memory film 103 includes a charge capturing film between the semiconductor body 102 and the conductive film 11. A plurality of columnar bodies CL1, each being selected from each finger, are commonly connected to one bit line BL via the contacts CT and VY. Each of the columnar bodies CL1 is provided in the cell region (Cell), for example (FIG. 3).

As illustrated in FIGS. 2A and 2B, the memory hole in the X-Y plane is in the shape of a circle or an ellipse, for example. A block insulating film 11a forming a portion of the memory film 103 may be provided between the conductive film 11 and the insulating film 12. The block insulating film 11a is a silicon oxide or a metal oxide, for example. One example of the metal oxide is an aluminum oxide. A barrier film 11b may be provided between the conductive film 11 and the insulating film 12 and between the conductive film 11 and the memory film 103. For example, when the conductive film 11 is tungsten, a stacked structure film of titanium nitride (TiN) and titanium (Ti) is selected for the barrier film 11b, for example. The block insulating film 11a prevents back tunneling of electric charges from the conductive film 11 to the memory film 103 side. The barrier film 11b improves the adhesion between the conductive film 11 and the block insulating film 11a.

The semiconductor body 102 is in the shape of a bottomed cylinder, for example. The semiconductor body 102 includes silicon, for example. The silicon is a polysilicon obtained by crystallizing amorphous silicon, for example. The semiconductor body 102 is an undoped silicon, for example. Further, the semiconductor body 102 may be a p-type silicon. The semiconductor body 102 serves as a channel for each of the drain-side select transistor STD, the memory cell MC, and the source-side select transistor STS.

A portion of the memory film 103 other than the block insulating film 11a is provided between the inner wall of the memory hole MH and the semiconductor body 102. The memory film 103 is in the shape of a cylinder, for example. The plurality of memory cells MC include region between the semiconductor body 102 and the conductive film 11 serving as the word line WL, and are stacked in the Z direction. The memory film 103 includes a cover insulating film 103a, a charge capturing film 103b, and a tunnel insulating film 103c, for example. Each of the semiconductor body 102, the charge capturing film 103b, and the tunnel insulating film 103c extends in the Z direction. As described above, each of the plurality of columnar bodies CL1 includes the semiconductor body 102 extending in the stacked body 1 in the Z direction and the memory film 103 provided on the outer peripheral surface of the semiconductor body 102.

The cover insulating film 103a is provided between the insulating film 12 and the charge capturing film 103b. The cover insulating film 103a includes a silicon oxide, for example. The cover insulating film 103a protects the charge capturing film 103b so that the charge capturing film 103b is not etched when the sacrificial film (not illustrated) is replaced with the conductive film 11 (replacement process). The cover insulating film 103a may be removed from between the conductive film 11 and the memory film 103 in the replacement process. In this case, as illustrated in FIGS. 2A and 2B, for example, the block insulating film 11a is provided between the conductive film 11 and the charge capturing film 103b. Further, when the replacement process is not used for forming the conductive film 11, the cover insulating film 103a may be omitted.

The charge capturing film 103b is provided between the block insulating film 11a and the cover insulating film 103a and the tunnel insulating film 103c. For example, the charge capturing film 103b includes silicon nitride (SiN) and has a trap site that traps charges in the film. The portion of the charge capturing film 103b interposed between the conductive film 11 serving as the word line WL and the semiconductor body 102 forms a memory region of the memory cell MC as a charge capture portion. The threshold voltage of the memory cell MC changes according to the presence or absence of charge in the charge capture portion or the amount of charge captured in the charge capture portion. As a result, the memory cell MC stores information.

The tunnel insulating film 103c is provided between the semiconductor body 102 and the charge capturing film 103b. The tunnel insulating film 103c includes a silicon oxide, or a silicon oxide and a silicon nitride, for example. The tunnel insulating film 103c is a potential barrier between the semiconductor body 102 and the charge capturing film 103b. For example, when injecting electrons from the semiconductor body 102 into the charge capture portion (write operation) and when injecting holes from the semiconductor body 102 into the charge capture portion (erasing operation), the electrons and the holes each pass through (tunneling) the potential barrier of the tunnel insulating film 103c.

The core layer 101 is buried in an internal space of the cylindrical semiconductor body 102. The core layer 101 is in the shape of a pillar, for example. For example, the core layer 101 includes a silicon oxide and has an insulating property.

A plurality of columnar bodies CLHR in FIG. 3 are provided in holes HR provided in the stacked body 1, respectively. The holes HR penetrate the stacked body 1 from the upper end of the stacked body 1 along the Z direction, through the stacked body 1 down to the semiconductor portion 33. The columnar body CLHR includes silicon oxide. Further, each of the columnar bodies CLHR may have the same configuration as the columnar bodies CL1. Each of the columnar bodies CLHR is provided in the staircase region (Staircase) and the tap region (Tap), for example. When a sacrificial film (not illustrated) is replaced with the conductive film 11 (replacement process), the columnar bodies CLHR serve as support members for holding the voids formed in the staircase region and the tap region.

The semiconductor memory device 100 further includes a semiconductor portion 14. The semiconductor portion 14 is located between the stacked body 1 and the semiconductor portion 33. For example, the conductive type of the semiconductor portion 14 is an n-type and may serve as a source-side select gate SGS.

Figure 4A:
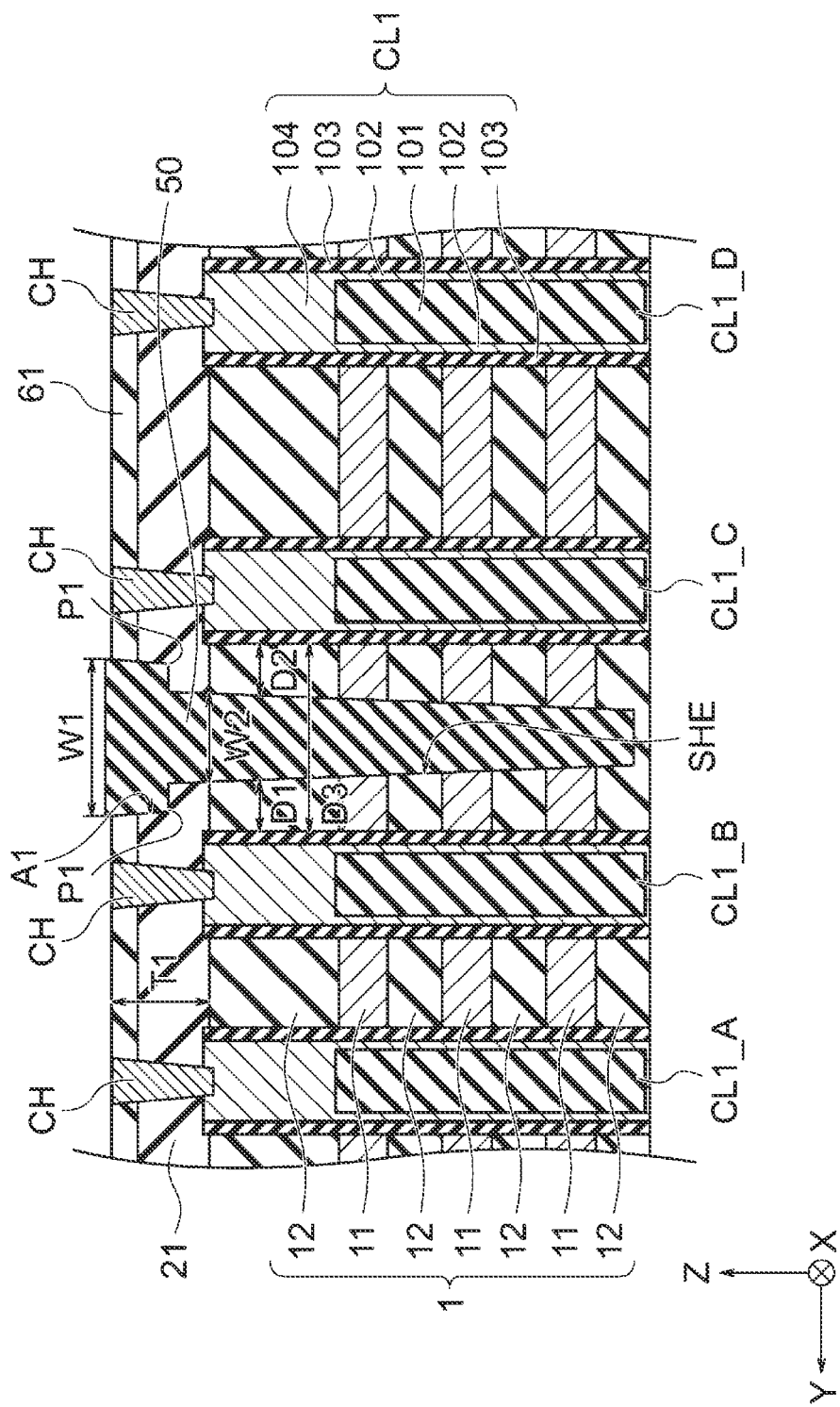
FIG. 4A is a schematic cross-sectional view illustrating a cross section taken along line A-A of FIG. 3.

FIG. 4A is a schematic cross-sectional view taken along line A-A of FIG. 3. The semiconductor memory device 100 includes the stacked body 1, the plurality of columnar bodies CL1 (columnar bodies CL1_A to CL1_D) extending in the stacked body 1 in the Z direction, the guide insulating film 21 provided above the stacked body 1, an insulating layer 61 provided above the guide insulating film 21, and the insulator 50 penetrating the guide insulating film 21 and the insulating layer 61 in the Z direction. The insulating layer 61 is an example of the first insulating layer.

The plurality of columnar bodies CL1 include the core layer 101, the semiconductor body 102 provided on an outer peripheral surface of the core layer 101, and the memory film 103 provided on an outer peripheral surface of the semiconductor body 102, and further include a cap layer 104 in an upper portion. For example, the cap layer 104 includes an n-type amorphous silicon and is electrically connected to the semiconductor body 102.

As described above, the guide insulating film 21 is formed of a material different from that of the insulating film 12 of the stacked body 1. For example, when the insulating film 12 is a silicon oxide film, the guide insulating film 21 is formed of an insulating material other than the silicon oxide. For example, the silicon nitride (SiN) or the aluminum oxide ($Al_2O_3$) is used for the guide insulating film 21. When the guide insulating film 21 includes silicon nitride, its thickness T1 is 400 nm or less, for example. When the guide insulating film 21 includes aluminum oxide, its thickness T1 is 350 nm or less, for example. For example, a silicon oxide film formed by using TEOS (Tetra Ethoxy Silane) is used for the insulating layer 61.

A contact CH is provided on each columnar body CL1. The contact CH is electrically connected to the semiconductor body 102 of each columnar body CL1.

The insulator 50 in the shallow slit SHE penetrates the guide insulating film 21 in the Z direction through an opening A1 of the guide insulating film 21. The opening A1 has a step on its side surface. That is, the opening A1 has a step at an interface between the insulator 50 and the guide insulating film 21. The interface between the insulator 50 and the guide insulating film 21 has a step in a cross section substantially perpendicular to the X direction in which the shallow slit SHE extends.

In reality, the interface between the insulator 50 and the guide insulating film 21 may include a curved surface such as a tapered shape (profile) having an inflection point or an otherwise corner. More specifically, the opening A1 has a tapered shape in which a width W1 of an upper end portion in the Z direction is larger than a width W2 of a lower end portion. The tapered shape of the opening A1 has a step in the middle of the thickness direction (Z direction) of the guide insulating film 21, or has an inflection point P1. When a taper ratio at the inflection point P1 changes gradually, a side surface of the opening A1 is a curved surface, and when the taper ratio at the inflection point P1 changes abruptly, the taper shape of the opening A1 is a step. It should be noted that the number of inflection points in the tapered shape of the opening A1 is not particularly limited and there may be any number of inflection points.

Further, the insulator 50 penetrates at least one layer of conductive film 11 in the upper-layer portion of the stacked body 1. For example, the insulator 50 penetrates three layers of the conductive films 11 from the uppermost layer of the stacked body 1 between the columnar body CL1_B and the columnar body CL1_C. As a result, the insulator 50 can electrically divide the conductive films 11 in the upper-layer portion of the stacked body 1 (for example, three conductive films 11 from the uppermost layer), and make the divided conductive films 11 of the upper-layer portion serve as the drain-side select gates SGD. Since each of the divided drain-side select gates SGD is separated by the insulator 50, it is possible to selectively supply the power to any of the drain-side select gates SGD.

Next, the function of the guide insulating film 21 will be described.

In order to assure the normal function of the drain-side select gates SGD, it is necessary to secure a distance between the insulator 50 and the columnar bodies CL1. For example, the distance between the insulator 50 and the columnar body CL1_B is set to D1, and the distance between the insulator 50 and the columnar body CL1_C is set to D2. In this case, by assuring that the distances D1 and D2 are equal to or greater than a predetermined distance, the conductive films 11 in the upper-layer portion adjacent to the columnar body CL1_B or the columnar body CL1_C can normally function as the drain-side select gates SGD. As a result, the drain-side select transistors STD can normally allow the cell current to flow. In addition, D3 is a distance between the columnar body CL1_B and the columnar body CL1_C. The distance D3 is the sum of the distance D1, the distance D2, and the width W2 of the insulator 50. In addition, preferably, the distance D2 is approximately equal to the distance D1.

By the way, as described above, the stacked body 1 is formed by, first, forming a stacked body 1a of the insulating films 12 and sacrificial films 11c (see FIG. 5 and the like), and replacing the sacrificial films 11c with the conductive films 11 (replacement process). In the replacement process, stress is applied to the stacked body 1 due to thermal shrinkage of the conductive films 11, and the columnar bodies CL1 in the stacked body 1 may be inclined. At this time, since the shallow slit SHE and the insulator 50 are formed after the replacement process, they might not be formed at a desired position with respect to the stacked body 1. The misalignment of the shallow slit SHE and the insulator 50 will be described below with reference to FIGS. 11A to 11D.

The misalignment of the shallow slit SHE and the insulator 50 may cause a defect in the drain-side select gates SGD. For example, when the shallow slit SHE and the insulator 50 are in contact with the columnar body CL1_B or CL1_C, there is a possibility that the drain-side select gates SGD cannot normally on/off control the drain-side select transistors (STD in FIG. 1) and cannot normally allow the cell current to flow.

Therefore, according to the present embodiment, the guide insulating film 21 is provided on the stacked body 1 in order to secure the distances D1 and D2. The guide insulating film 21 is formed on the stacked body 1a after forming the stacked body 1a of the insulating film 12 and the sacrificial film 11c illustrated in FIG. 5 and before the replacement process. At this time, the opening A1 is formed in the guide insulating film 21. Since the guide insulating film 21 and the opening A1 are formed on the stacked body 1a before the replacement process, they can be formed at a desired position with respect to the stacked body 1a. For example, the opening A1 may be formed substantially in the middle between the columnar body CL1_B and the columnar body CL1_C. Then, even when the stacked body 1 is inclined by the stress from the conductive film 11 due to the replacement process, the guide insulating film 21 and the opening A1 on the stacked body 1 are moved together with the inclination of the stacked body 1. That is, in the replacement process, even when the stacked body 1 is inclined, the relative positions of the guide insulating film 21 and the opening A1 with respect to the stacked body 1 are not changed substantially. For example, when the opening A1 is substantially in the middle between the columnar body CL1_B and the columnar body CL1_C, the opening A1 is located substantially in the middle between the columnar body CL1_B and the columnar body CL1_C even after the replacement process. Therefore, by using the opening A1 of the guide insulating film 21 as a mask when forming the shallow slit SHE, the shallow slit SHE and the insulator 50 may be formed at a desired position with respect to the stacked body 1, which may be substantially in the middle between the columnar body CL1_B and the columnar body CL1_C, for example. Thus, it is possible to secure the distances D1 and D2, and the drain-side select gates SGD can normally on/off control the drain-side select transistors. As a result, the drain-side select transistors can normally allow the cell current to flow.

Figure 4B:
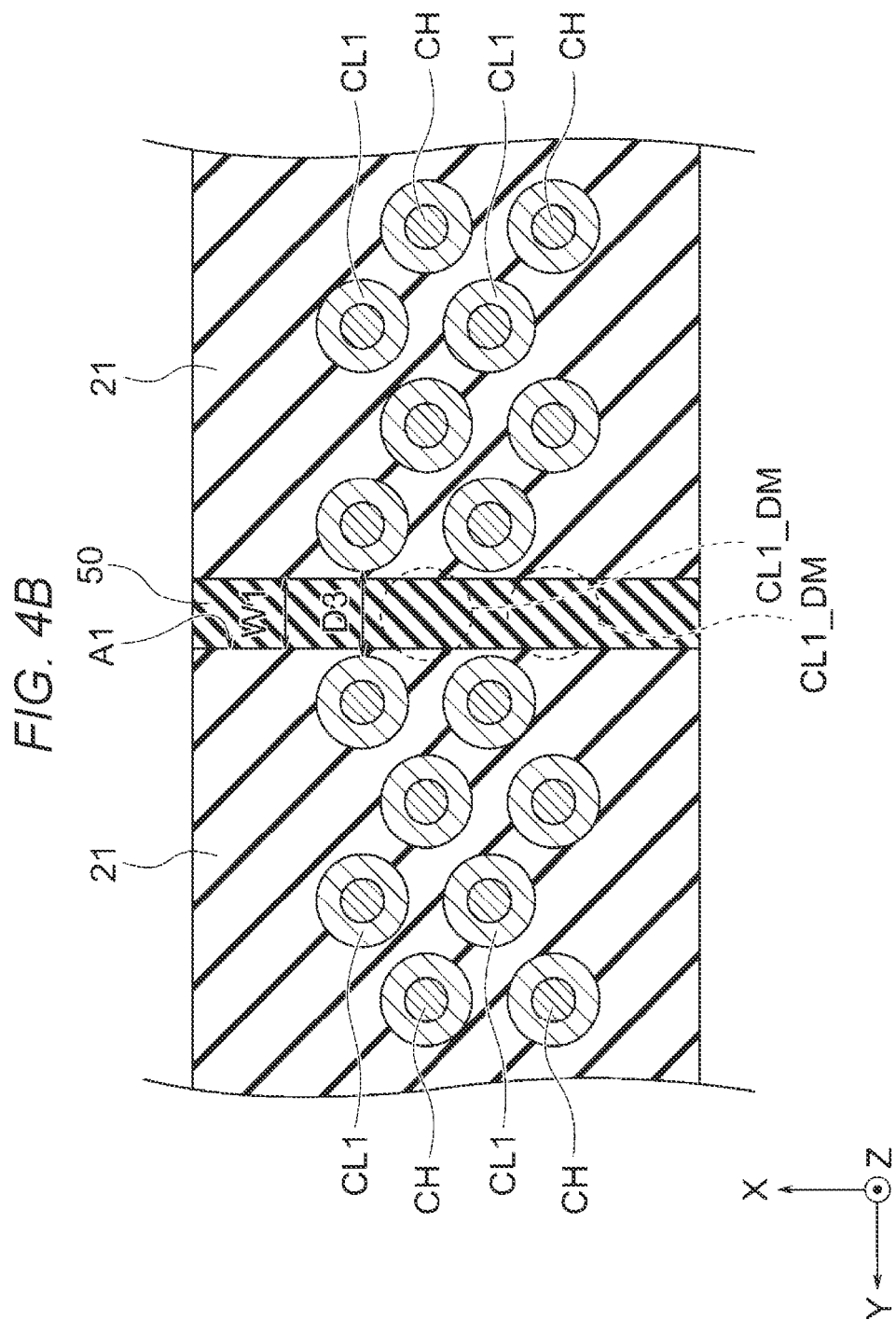
FIG. 4B is an enlarged plan view illustrating region B of FIG. 3.

FIG. 4B is an enlarged plan view illustrating the region B of FIG. 3. The plurality of columnar bodies CL1 are arranged two-dimensionally like, for example, a hexagonal close-packed arrangement, in a plan view of the X-Y plane viewed from the Z direction. The insulator 50 extends in the X direction. Therefore, the opening A1 of the guide insulating film 21 also extends in the X direction. Although not illustrated in FIG. 4B, the plate-shaped portion 40 (deep slit ST) also extends in the X direction like the insulator 50. Therefore, the insulator 50 and the plate-shaped portion 40 extend substantially parallel to each other in the X direction. Further, the columnar bodies CL1 overlapping each other under the insulator 50 may be provided. The columnar bodies CL1 under the insulator 50 are a dummy string (hereinafter, referred to as columnar bodies CL1_DM) and do not serve as the memory string in the semiconductor memory device 100. Further, the contacts CH and VY are provided above the plurality of columnar bodies CL1. The contacts CH and VY penetrate the guide insulating film 21 and are electrically connected to the plurality of columnar bodies CL1.

In the present embodiment, the first film corresponds to the insulator 50 in the shallow slit SHE, but may be interpreted to correspond to the drain-side select gate SGD between the adjacent shallow slits SHE. In this case, the first film may be a conductive material such as tungsten.

Next, a method for manufacturing the semiconductor memory device 100 will be described.

FIGS. 5 to 14 are schematic views illustrating an example of a method for manufacturing the semiconductor memory device 100 according to the first embodiment. For convenience, the shallow slit SHE and the deep slit ST are illustrated side by side in FIGS. 5 to 14.

Figure 5:
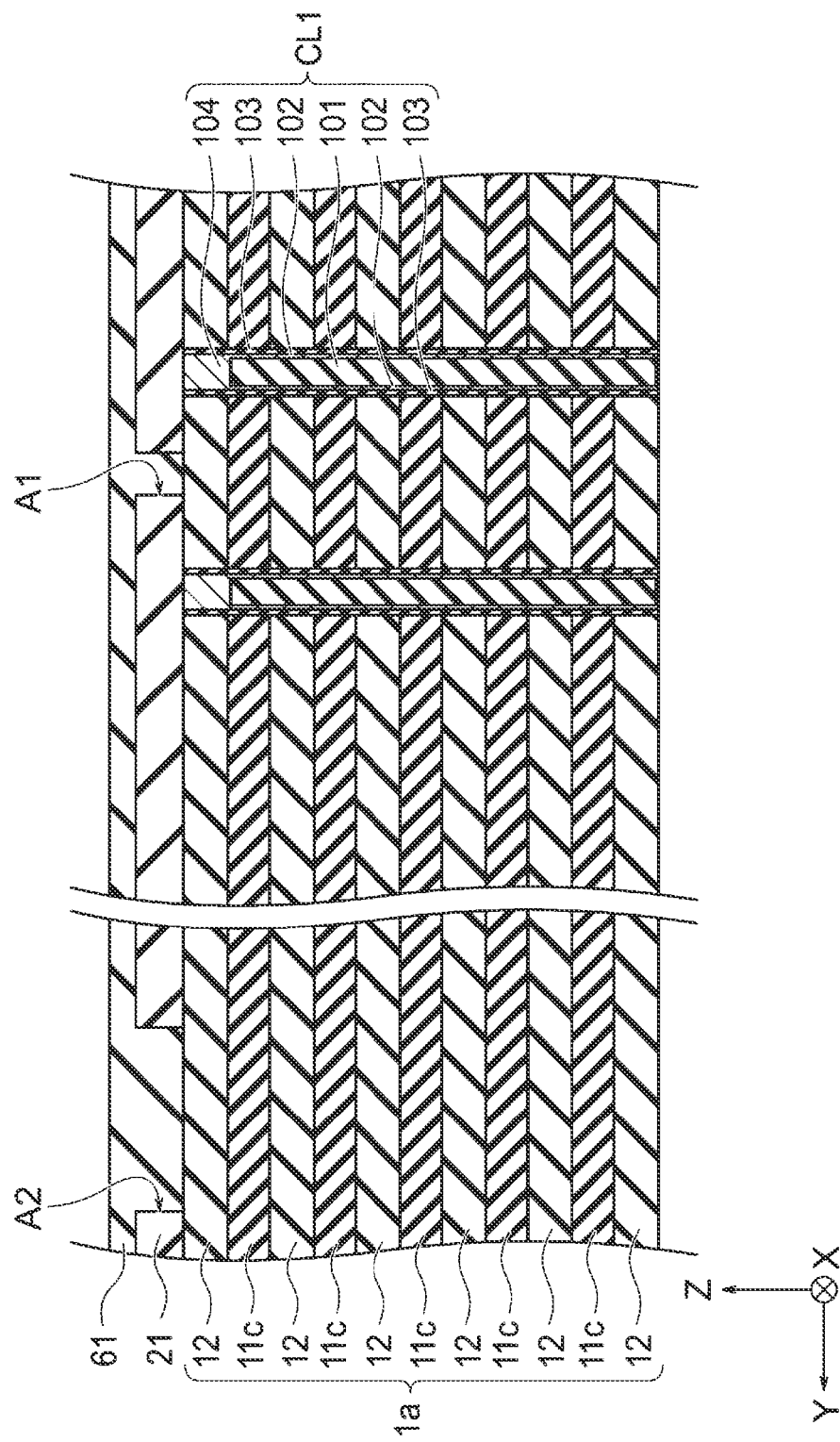
FIG. 5 is a schematic cross-sectional view illustrating a method for manufacturing semiconductor memory device according to the first embodiment.

First, as illustrated in FIG. 5, the stacked body 1a including the sacrificial films 11c and the insulating films 12 alternately stacked is formed on the base 3 of FIG. 1A. The sacrificial films 11c are an example of the first sacrificial film. For the insulating film 12, for example, a silicon oxide film is used, and for the sacrificial film 11c, for example, a silicon nitride film is used.

Next, a plurality of memory holes MH are formed in the stacked body 1a with the lithography technique, the etching technique, or the like. Next, the core layer 101, the semiconductor body 102 provided on an outer periphery of the core layer 101, and the memory film 103 provided on an outer periphery of the semiconductor body 102 are formed in the memory holes MH, and the plurality of columnar bodies CL1 are formed.

Next, the guide insulating film 21 is formed on the stacked body 1a. An insulating material different from that of the insulating film 12 is used for the guide insulating film 21. For example, when the insulating film 12 is a silicon oxide film, silicon nitride (SiN) or aluminum oxide (Al$_2$O$_3$) is used for the guide insulating film 21. As a result, the insulating films 12 or the guide insulating film 21 can be selectively etched. When the guide insulating film 21 is a silicon nitride film, the thickness of the guide insulating film 21 is preferably 400 nm or less, for example. When the guide insulating film 21 is an aluminum oxide film, the thickness of the guide insulating film 21 is preferably 350 nm or less, for example. Next, the opening A1 and an opening A2 are formed in the guide insulating film 21 by using the lithography technique and the etching technique. The opening A1 is used to form the shallow slit SHE. The opening A2 is used to form the deep slit ST. The openings A1 and A2 are formed so as to extend in the X direction substantially parallel to each other. That is, the openings A1 and A2 are formed in a striped shape in a plan view seen from the Z direction.

Next, a sacrificial film 61 is deposited on the guide insulating film 21. The sacrificial film 61 is filled in the opening A1 and the opening A2. The sacrificial film 61 is an example of the second sacrificial film. For example, a silicon oxide film formed by using TEOS (Tetra Ethoxy Silane) is used for the sacrificial film 61. As a result, the structure illustrated in FIG. 5 is obtained.

Figure 6:
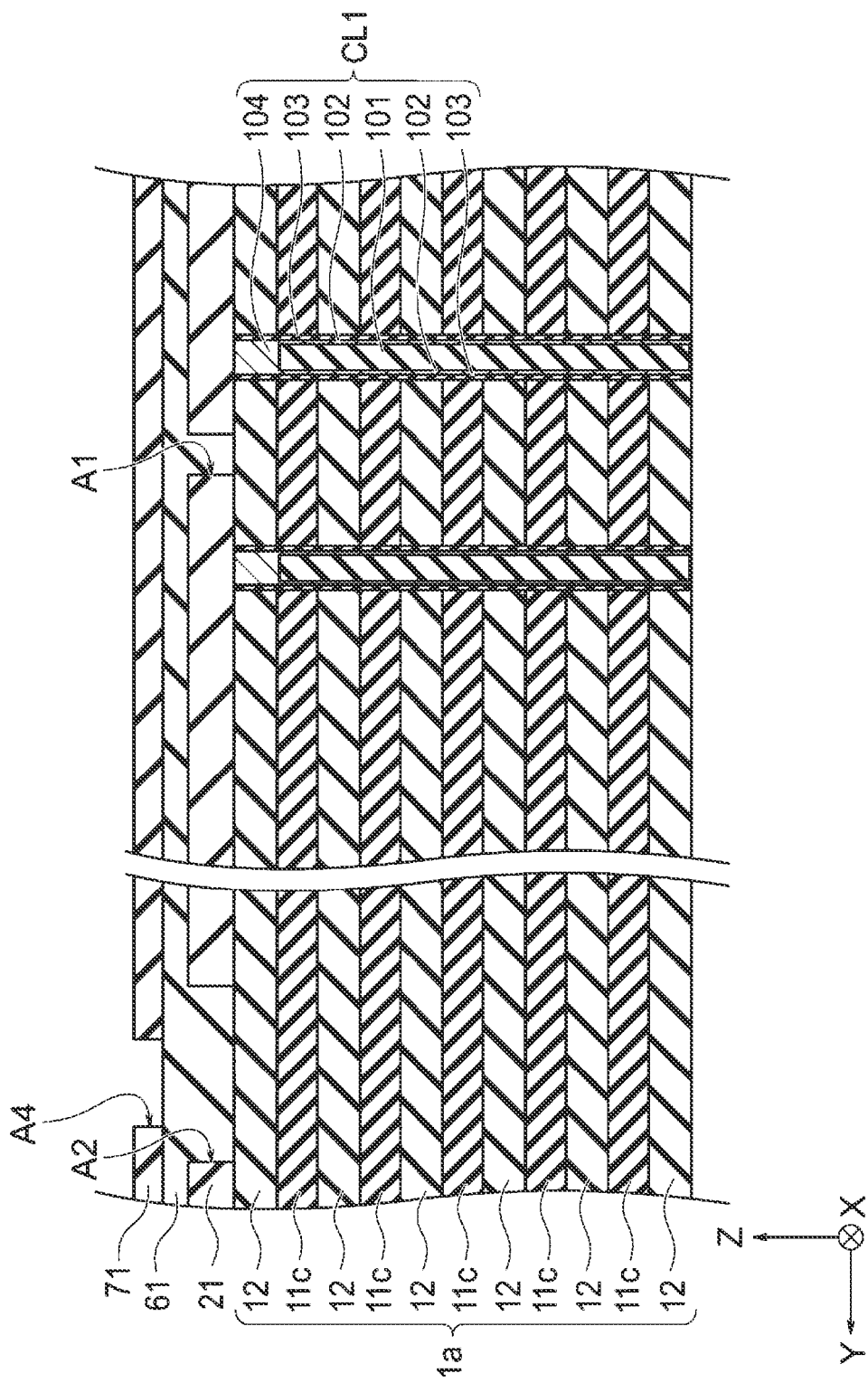
FIG. 6 is a schematic cross-sectional view illustrating, continuing from FIG. 5, the method for manufacturing a semiconductor memory device.

Next, as illustrated in FIG. 6, a photoresist film 71 is formed on the sacrificial film 61 with the lithography technique, and an opening A4 is formed in the photoresist film 71. The opening A4 is formed above the opening A2 of the guide insulating film 21. The opening A4 is formed so as to extend in the X direction like the opening A2. Meanwhile, in the cross section perpendicular to the X direction, the width of the opening A4 of the photoresist film 71 in the Y direction is narrower than the width of the opening A2 of the guide insulating film 21 in the Y direction.

Figure 7:
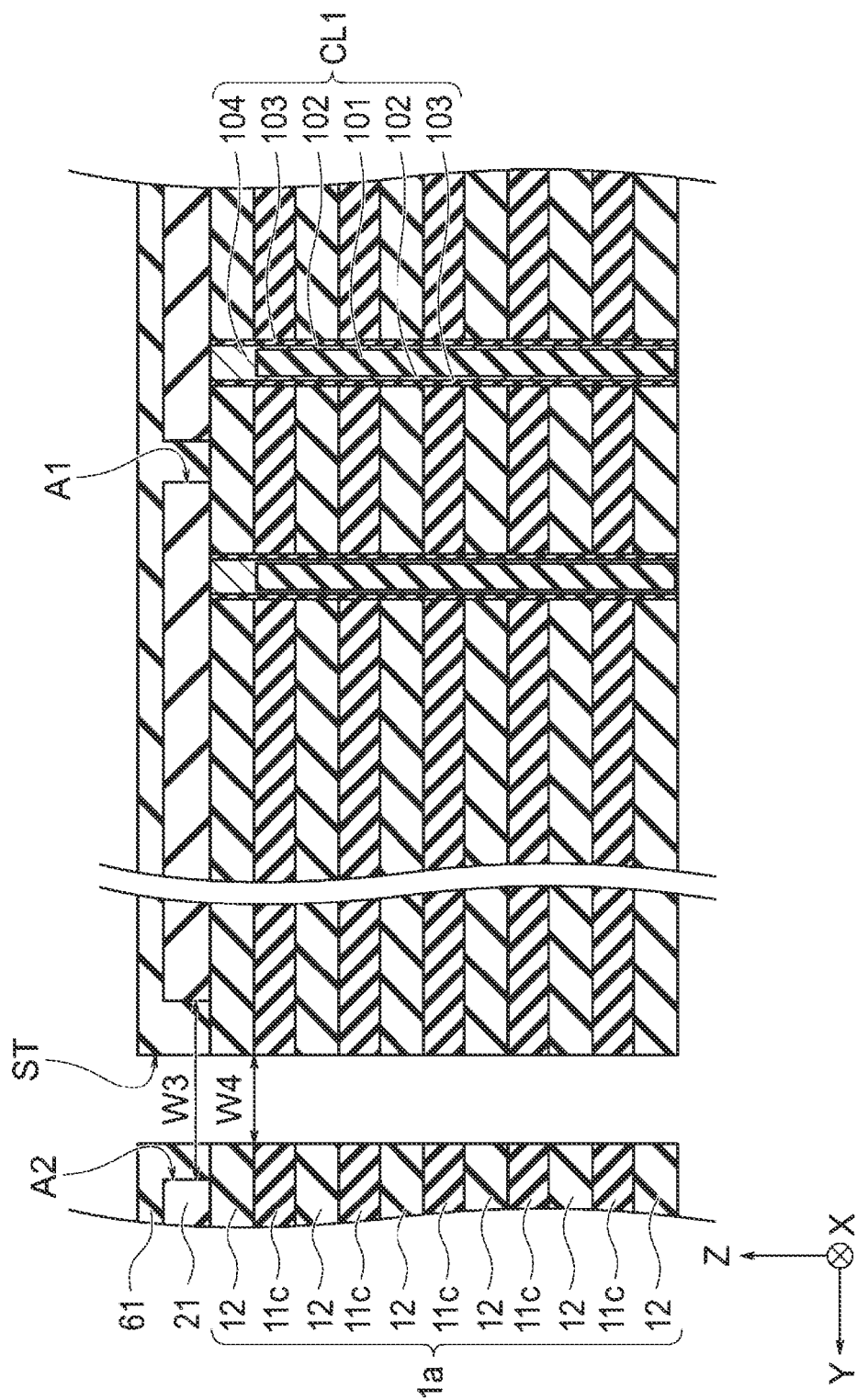
FIG. 7 is a schematic cross-sectional view illustrating, continuing from FIG. 6, the method for manufacturing a semiconductor memory device.

Next, as illustrated in FIG. 7, using the photoresist film 71 as a mask, a portion of the sacrificial film 61 in the opening A2 is removed by the etching technique. Next, using the sacrificial film 61 as a mask, the deep slit ST penetrating the stacked body 1a is formed by the etching technique such as a Reactive Ion Etching (RIE) method and the like. In this case, since the width of the opening A4 is narrower than the width of the opening A2, a width W4 of the deep slit ST in the Y direction is narrower than a width W3 of the opening A2 in the Y direction.

Next, the sacrificial films 11c of the stacked body 1a are removed with a phosphoric acid solution or the like through the deep slit ST to form first spaces between the insulating films 12 adjacent to each other in the Z direction. In the first space, the insulating films 12 and the columnar bodies CL1 are exposed.

Next, a barrier metal such as titanium nitride (TiN) and the like, for example, is formed on surfaces of the insulating films 12 and the columnar bodies CL1 exposed in the first spaces (not illustrated).

Next, a conductive metal such as tungsten (W) and the like is buried in the first spaces. As a result, as illustrated in FIG. 8, the conductive metal of the conductive films 11 is buried in the first spaces between the insulating films 12 adjacent to each other in the Z direction. The process of replacing the sacrificial films 11c with the conductive films 11 in the manner described above is called the replacement process.

Since the width W4 is narrower than the width W3, the guide insulating film 21 is separated from the plate-shaped portion 40, and the sacrificial film 61 is present between the guide insulating film 21 and the plate-shaped portion 40. As a result, the guide insulating film (for example, the silicon nitride film) 21 is covered with the sacrificial film 61 (for example, the silicon oxide film). Therefore, in the replacement process, the guide insulating film 21 is not etched when the sacrificial films (for example, the silicon nitride films) 11c are removed. As described above, by making the width W3 of the opening A2 of the guide insulating film 21 wider than the width W4 of the slit ST, the sacrificial films 11c can be selectively removed from the guide insulating film 21.

Figure 8:
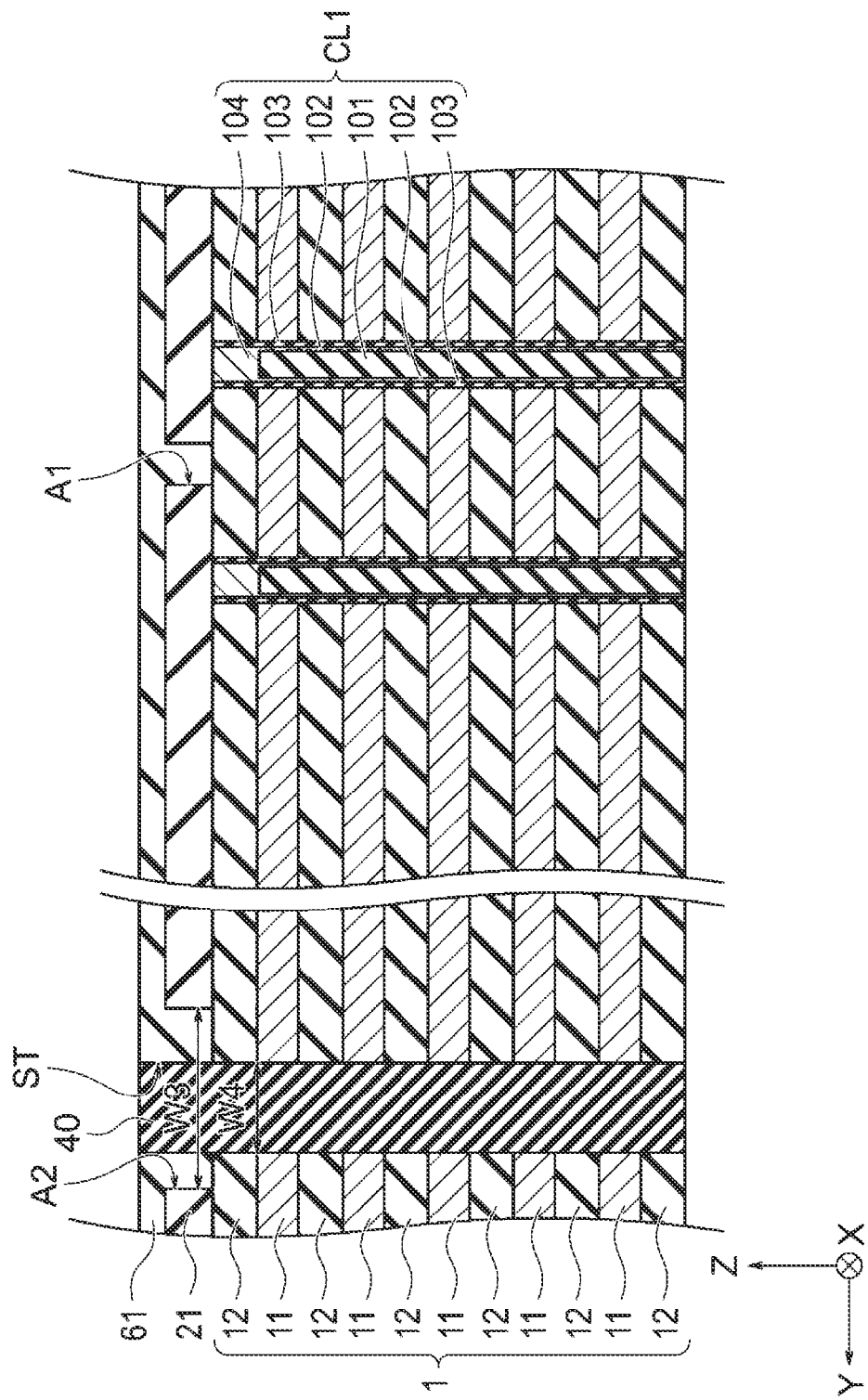
FIG. 8 is a schematic cross-sectional view illustrating, continuing from FIG. 7, the method for manufacturing a semiconductor memory device.

Next, as illustrated in FIG. 8, the deep slit ST is filled with an insulating film such as silicon oxide and the like to form the plate-shaped portion 40. The plate-shaped portion 40 penetrates the stacked body 1 and the guide insulating film 21 in the Z direction. As a result, the memory cell interposed between two adjacent plate-shaped portions 40 is defined as a block. The guide insulating film 21 is also separated from the plate-shaped portion 40. In the plate-shaped portion 40, an insulating film such as silicon oxide and the like may be formed in the deep slit ST, and a conductive material may be buried therein. As a result, the deep slit ST can be used as wiring while serving as an insulative isolating portion between the blocks.

Figure 9:
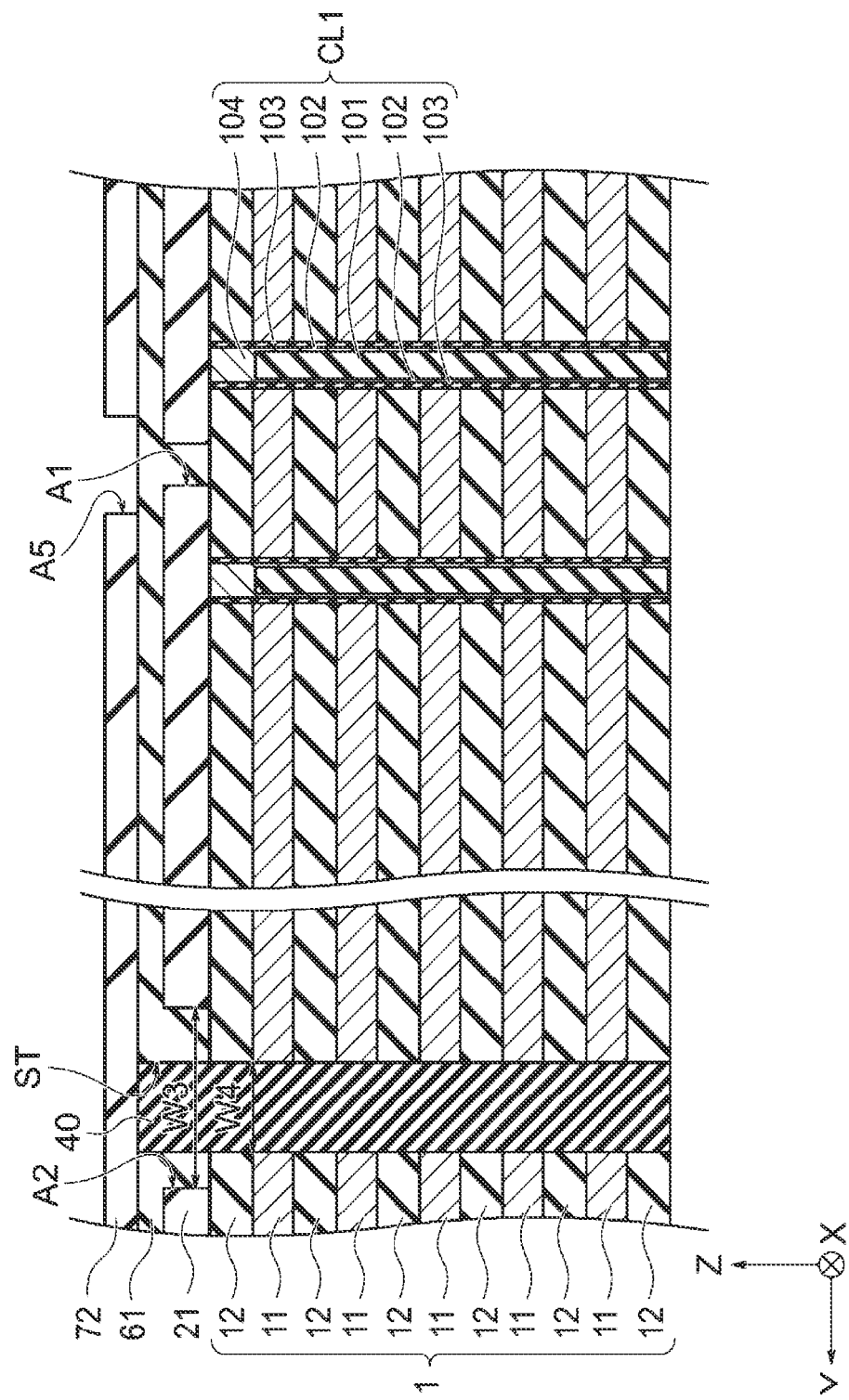
FIG. 9 is a schematic cross-sectional view illustrating, continuing from FIG. 8, the method for manufacturing a semiconductor memory device.

Next, as illustrated in FIG. 9, a photoresist film 72 is formed on the sacrificial film 61 with the lithography technique, and an opening A5 is formed in the photoresist film 72. The opening A5 is formed above the opening A1 of the guide insulating film 21. The opening A5 is formed so as to extend in the X direction like the opening A1. Meanwhile, in the cross section perpendicular to the X direction, the width of the opening A5 of the photoresist film 72 in the Y direction is wider than the width of the opening A1 of the guide insulating film 21 in the Y direction.

Figure 10:
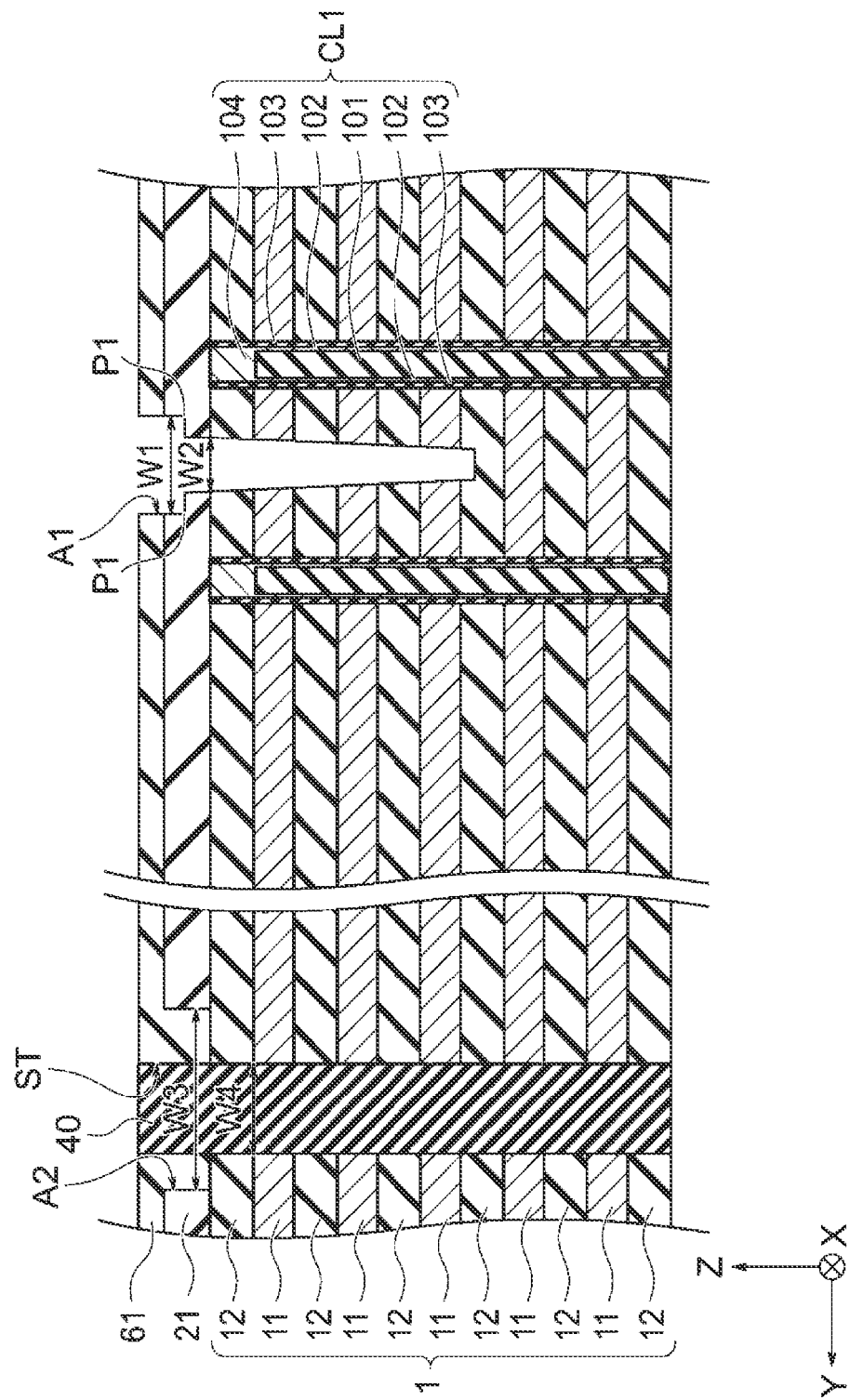
FIG. 10 is a schematic cross-sectional view illustrating, continuing from FIG. 9, the method for manufacturing a semiconductor memory device.

Next, using the photoresist film 72 as a mask, the sacrificial film 61 in the region including the opening A1 is selectively removed by the etching technique. Next, as illustrated in FIG. 10, using the sacrificial film 61 and the guide insulating film 21 as masks, the shallow slit SHE that penetrates the guide insulating film 21 and penetrates the conductive films 11 of the upper-layer portion of the stacked body 1 is formed. In the present embodiment, the shallow slit SHE penetrates the three layers of the conductive films 11 in the upper-layer portion. However, it suffices that the shallow slit SHE penetrates at least one layer of the conductive film 11 of the upper-layer portion. At this time, the upper portion of the guide insulating film 21 is etched by using the sacrificial film 61 including the opening A5 wider than the opening A1 of the guide insulating film 21 as a mask. Therefore, the upper portion of the guide insulating film 21 is etched with the relatively wider width W1, and the lower portion of the guide insulating film 21 remains in the relatively narrower width W2. Further, the upper-layer portion of the stacked body 1 is etched by using the guide insulating film 21 having the opening A1 as a mask. Therefore, the shallow slit SHE formed in the upper-layer portion of the stacked body 1 is formed with the relatively narrower width W2 or less. In addition, the sacrificial film 61 remaining on the guide insulating film 21 in this process is an example of the first film.

As described above, the width W1 of the upper portion of the opening A1 is formed wider than the width W2 of the lower portion of the opening A1. A step is formed on the side surface of the opening A1. Alternatively, a curved tapered shape having the inflection point P1 is formed on the side surface of the opening A1.

When the taper ratio at the inflection point P1 changes gradually, the side surface of the opening A1 is a curved surface, and when the taper ratio at the inflection point P1 changes abruptly, the taper shape of the opening A1 is a step. The number of inflection points in the tapered shape of the opening A1 is not particularly limited and there may be any number of inflection points.

Figure 11A:
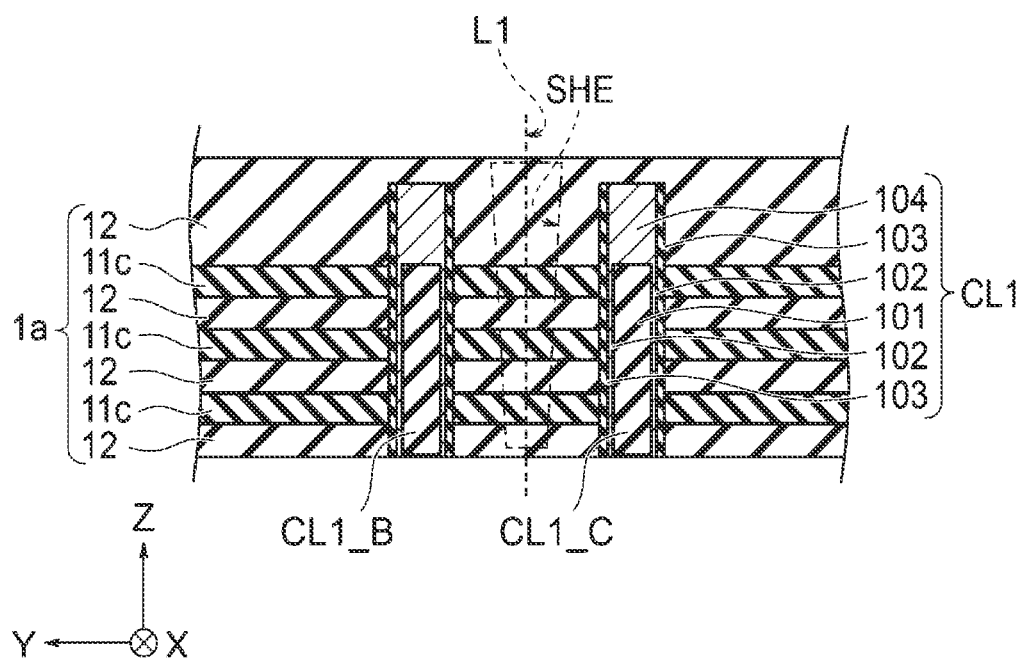
FIG. 11A is a schematic cross-sectional view illustrating the first stacked body without a guide insulating film before a replacement process.
Figure 11B:
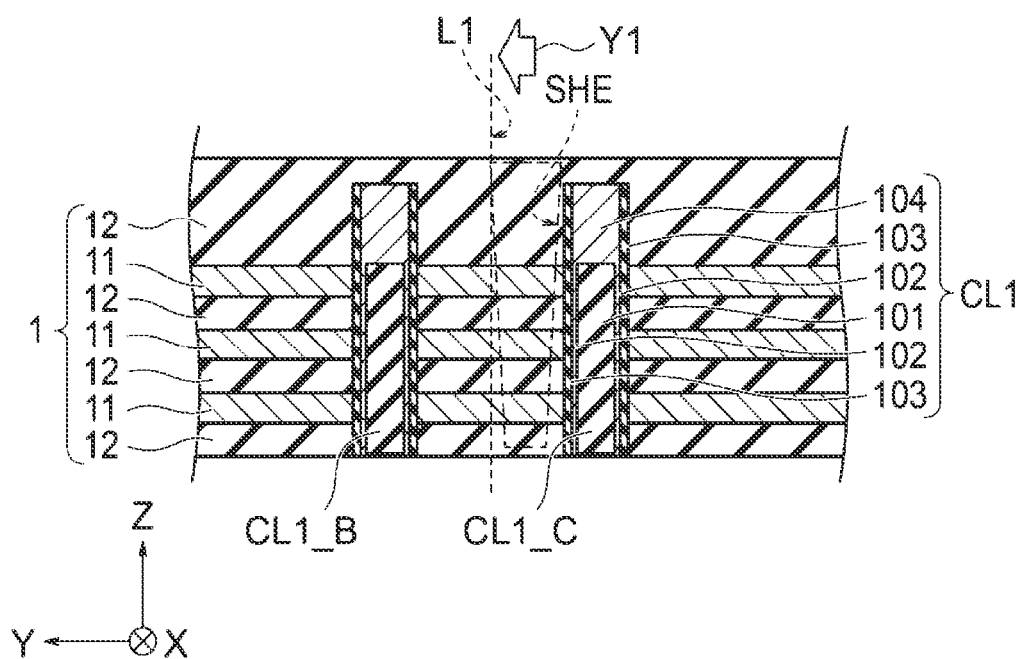
FIG. 11B is a schematic cross-sectional view illustrating the first stacked body without a guide insulating film after the replacement process.
Figure 11C:
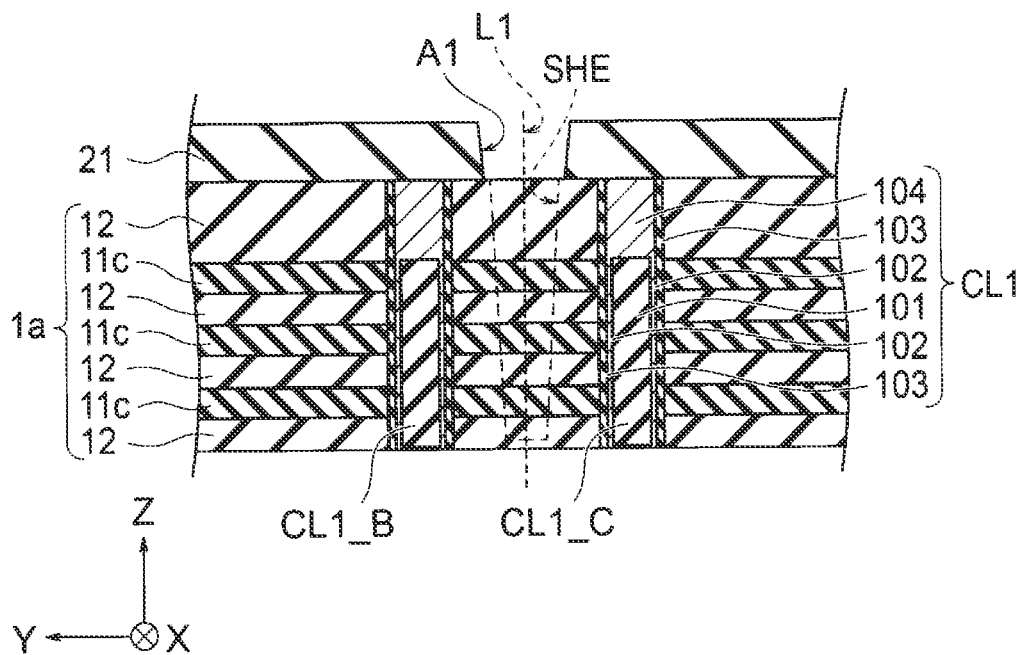
FIG. 11C is a schematic cross-sectional view illustrating the first stacked body according to the first embodiment before the replacement process.
Figure 11D:
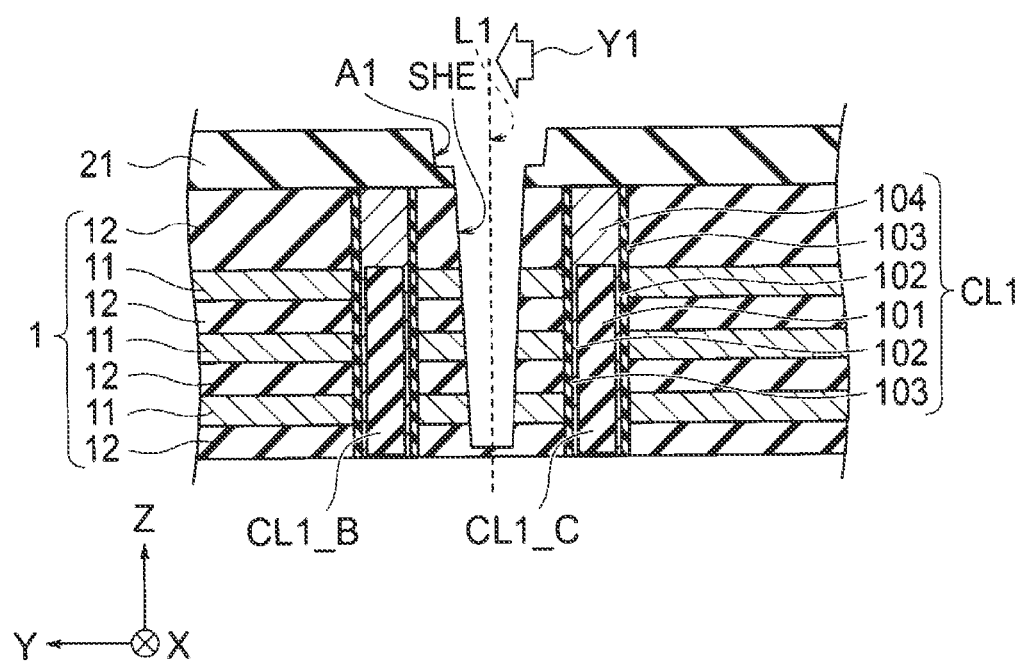
FIG. 11D is a schematic cross-sectional view illustrating the first stacked body according to the first embodiment after the replacement process.

In this example, the misalignment of the shallow slit SHE due to the replacement process described above will be described in more detail with reference to FIGS. 11A to 11D. FIGS. 11A and 11B illustrate a case where the shallow slit SHE is formed without using the guide insulating film 21. FIGS. 11C and 11D illustrate a case where a shallow slit SHE is formed by using the guide insulating film 21 according to the present embodiment.

FIGS. 11A and 11B illustrate the upper layers of the stacked body 1 (or 1a) before and after the replacement process, respectively.

As illustrated in FIGS. 11A and 11B, in the replacement process, the sacrificial films 11c are replaced with the conductive films 11. At this time, the conductive metal has a thermal shrinkage as it is cooled. The larger the volume of the conductive metal, the greater the thermal shrinkage of the conductive metal. Therefore, a deviation in the volume of the conductive metal (for example, tungsten) of the conductive film 11 results in the stacked body 1 being pulled to one side and the stacked body 1 being inclined.

For example, when an intermediate line between the columnar body CL1_B and the columnar body CL1_C adjacent to each other before the replacement process of FIG. 11A is L1, after the replacement process of FIG. 11B, the intermediate line L1 may be moved to the columnar body CL1_B side (Y1 direction) due to the influence of thermal shrinkage of the conductive film 11. In this case, while a planned formation position of the shallow slit SHE is on the intermediate line L1 before the replacement process of FIG. 11A, this is moved to a side opposite to Y1 direction and close to the columnar body CL1_C after the replacement process of FIG. 11B. Since there is no alignment index in the lithography process for such movement of the columnar bodies CL1_B and CL1_C, if the shallow slit SHE is formed as planned at the planned formation position, there is a risk of contact with the columnar body CL1_C.

Meanwhile, in FIGS. 11C and 11D, the guide insulating film 21 having the opening A1 is formed on the stacked body 1. As described above, the opening A1 is formed at the position of the intermediate line L1 of the guide insulating film 21. After the replacement, the guide insulating film 21 is moved in the arrowed direction Y1 together with the columnar body CL1_B and the columnar body CL1_C. Therefore, the relative positional relationship between the opening A1 and the columnar bodies CL1_B and CL1_C remains almost unchanged before and after the replacement process. In other words, the distance between the opening A1 and the columnar body CL1_B and the distance between the opening A1 and the columnar body CL1_C remain almost unchanged before and after the replacement process. Therefore, when the shallow slit SHE is formed by using the opening A1, the shallow slit SHE can be formed in a self-aligned manner at the position of the intermediate line L1 as illustrated in FIG. 11D. Therefore, the distance between the shallow slit SHE and the columnar body CL1_B and the distance between the shallow slit SHE and the columnar body CL1_C can be secured. As a result, it is possible to prevent the defective formation of the drain-side select gates SGD.

As described above, the opening A1 of the guide insulating film 21 serves as a guide that indicates a position where the shallow slit SHE is to be formed. The shallow slit SHE can be formed in a self-aligned manner in the intermediate line L1 by the opening A1 of the guide insulating film 21. In addition, the opening A1 of the guide insulating film 21 can also serve as an index of alignment in the lithography process of FIG. 6 or FIG. 9.

Figure 12:
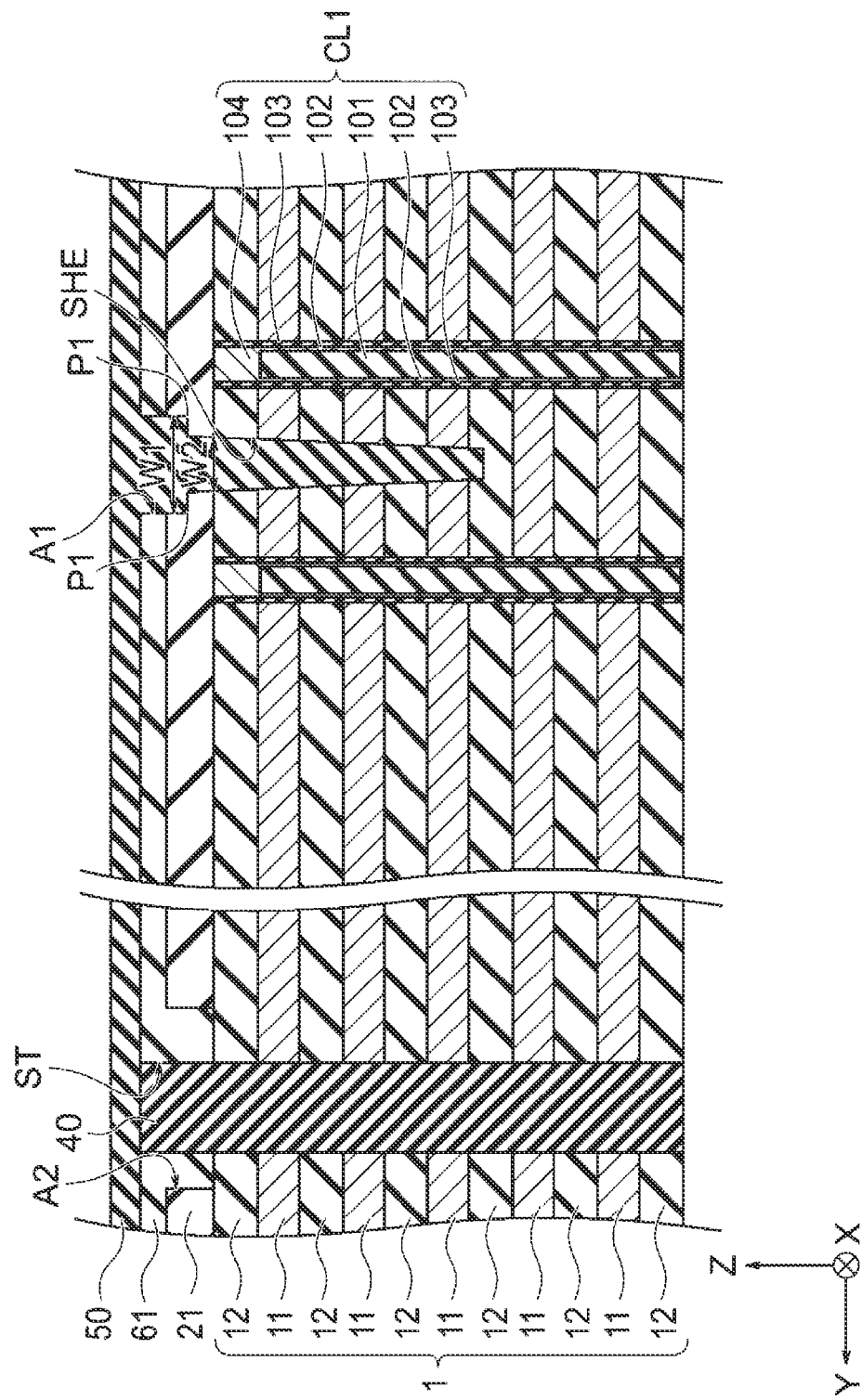
FIG. 12 is a schematic cross-sectional view illustrating, continuing from FIG. 10, the method for manufacturing a semiconductor memory device.

Next, as illustrated in FIG. 12, the insulator 50 is filled in the shallow slit SHE and formed on the sacrificial film 61. For the insulator 50, a silicon oxide is used, for example. In the present embodiment, the first film corresponds to the insulator 50 in the shallow slit SHE, but may be interpreted to correspond to the drain-side select gate SGD between the adjacent shallow slits SHE. In this case, the first film may be a conductive material such as tungsten.

Figure 13:
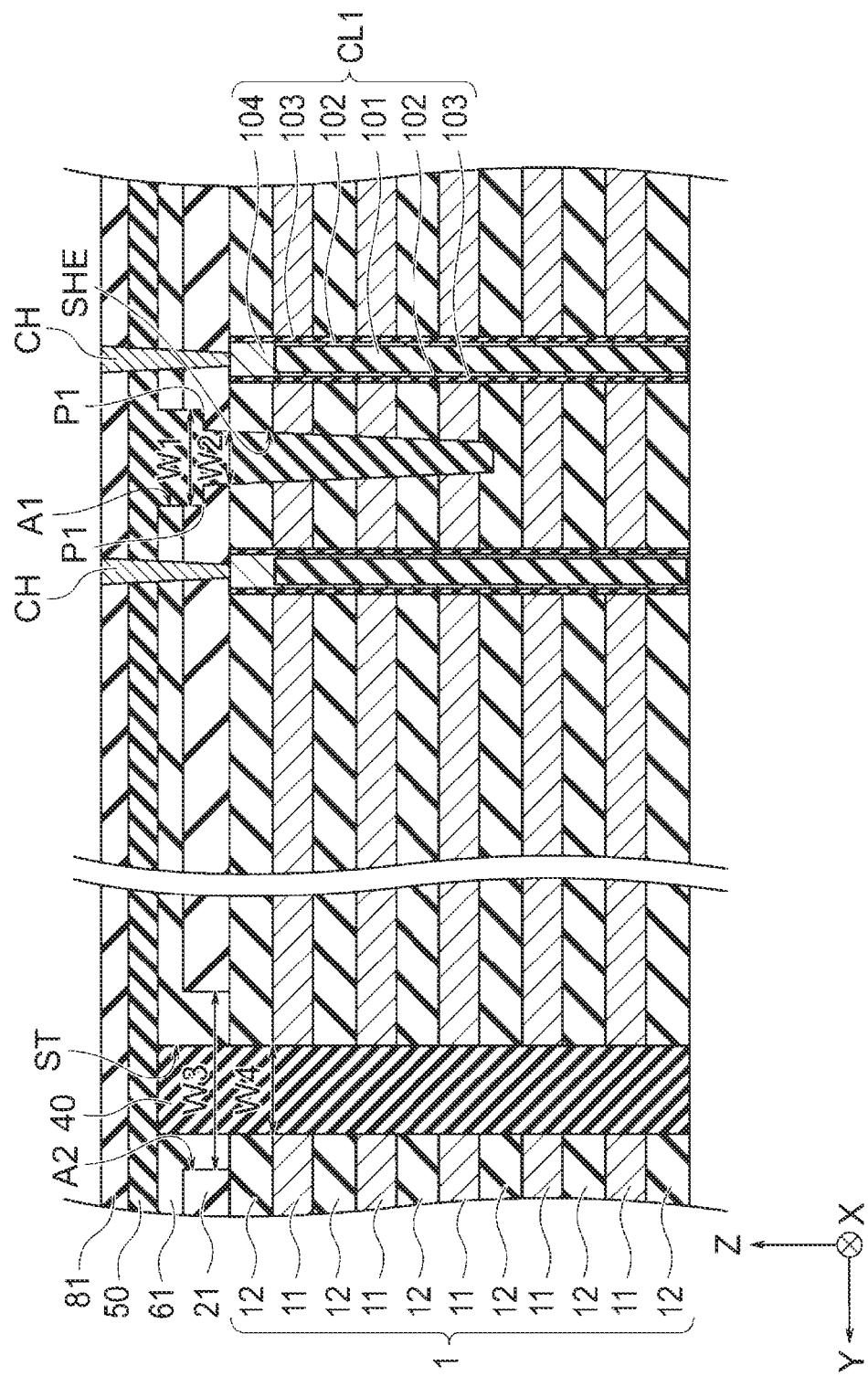
FIG. 13 is a schematic cross-sectional view illustrating, continuing from FIG. 12, the method for manufacturing a semiconductor memory device.

Next, as illustrated in FIG. 13, an interlayer insulating film 81 is formed on the insulator 50. For the interlayer insulating film 81, a silicon oxide is used, for example. Next, the interlayer insulating film 81, the insulator 50, the sacrificial film 61, and the guide insulating film 21 on the columnar body CL1 are processed using the lithography technique and the etching technique to form contact holes at the positions where the contacts CH are formed. The contact holes are formed to a depth reaching an upper surface of the cap layer 104, and may be substantially oblate or substantially elliptical in a plan view from the Z direction. Next, the contact holes are filled with titanium (Ti), titanium nitride (TiN) or tungsten (W), and this is polished by a Chemical Mechanical Polishing (CMP) method. As a result, as illustrated in FIG. 13, the contacts CH are formed.

Figure 14:
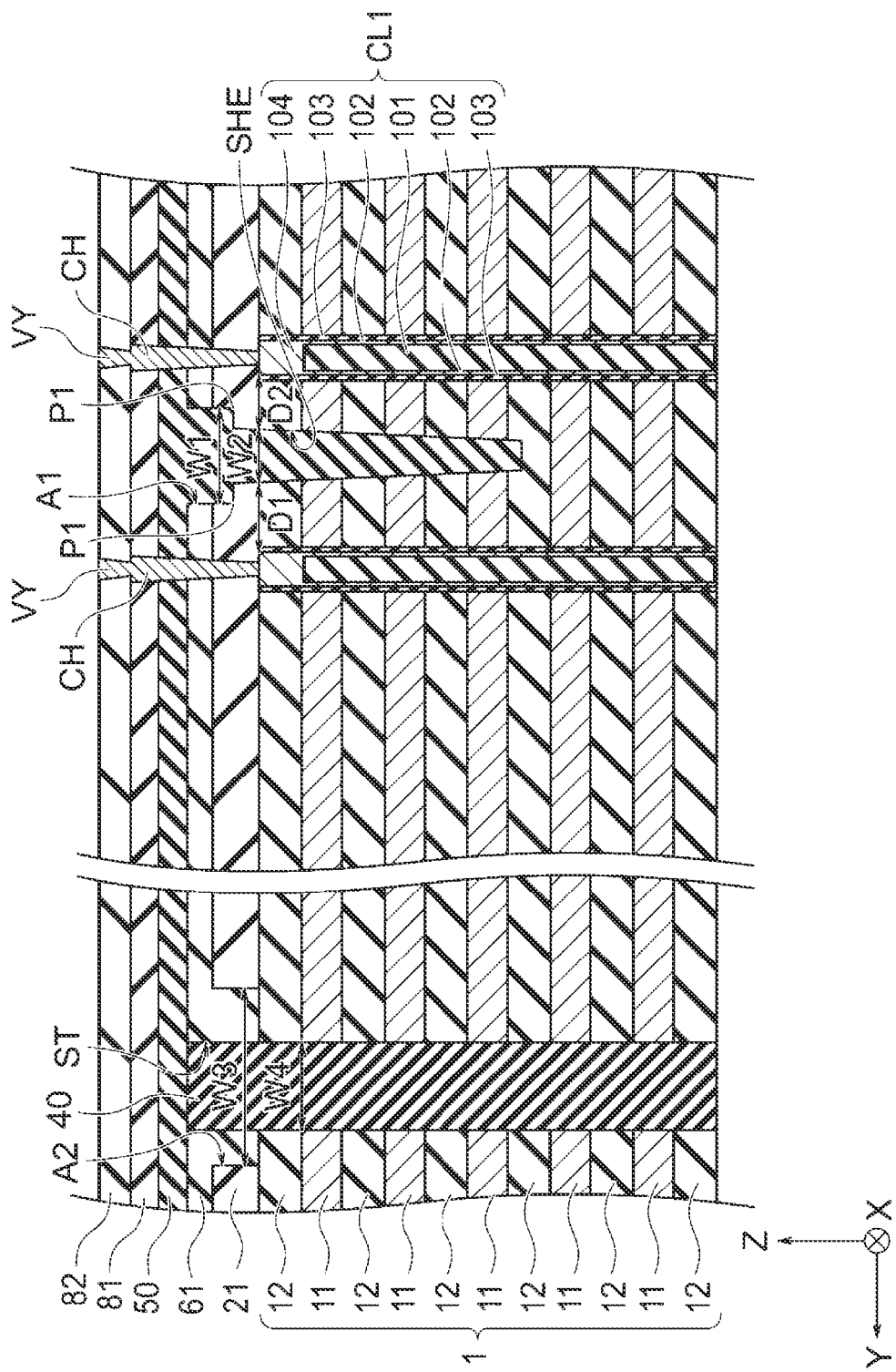
FIG. 14 is a schematic cross-sectional view illustrating, continuing from FIG. 13, the method for manufacturing a semiconductor memory device.
Figure 15:
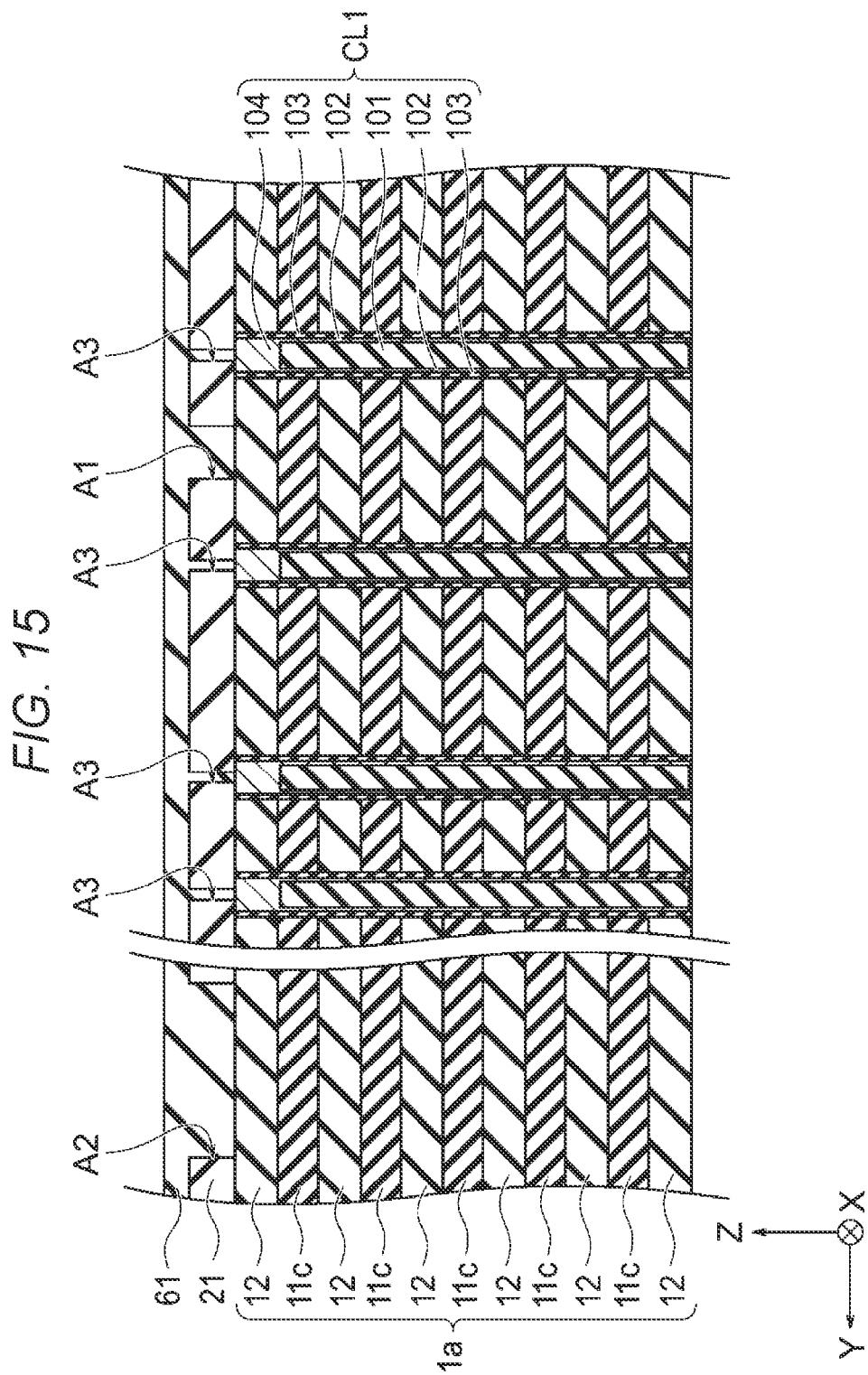
FIG. 15 is a schematic cross-sectional view illustrating a method for manufacturing a semiconductor memory device according to a second embodiment.

Next, as illustrated in FIG. 14, an interlayer insulating film 82 is formed on the interlayer insulating film 81. For the interlayer insulating film 82, a silicon oxide is used, for example. Next, via holes formed in the interlayer insulating film 82 on the contacts CH with the lithography technique and the etching technique. The via holes are formed to a depth reaching the upper surface of the contacts CH, and may be substantially circular or substantially elliptical in a plan view from the Z direction. Next, the via holes are filled with titanium, titanium nitride or tungsten, and this is polished by the CMP method. As a result, via contacts VY are formed.

Then, although not illustrated, a plurality of bit lines are provided above the contacts VY to be electrically connected to the contacts VY. As a result, the bit lines and the columnar bodies CL1 are electrically connected to each other via the contacts CH and VY. The bit line extends in a direction substantially orthogonal to the extending direction of the insulator 50 (Y direction) in a plan view seen from the Z direction. Then, the other multilayer wiring structure or the like is formed, and the semiconductor memory device 100 according to the first embodiment is completed.

As described above, in the semiconductor memory device 100 according to the first embodiment, the guide insulating film 21 having the opening A1 is provided on the stacked body 1. The guide insulating film 21 is formed on the stacked body 1a after forming the stacked body 1a of the insulating films 12 and the sacrificial films 11c and before the replacement process. Therefore, even when the stacked body 1 is inclined by the replacement process, the guide insulating film 21 and the opening A1 are moved with the inclination of the stacked body 1, and the relative positions of the guide insulating film 21 and the opening A1 with respect to the stacked body 1 are not changed. Therefore, the opening A1 of the guide insulating film 21 may be an index of an appropriate position of the shallow slit SHE and the insulator 50 formed thereafter. That is, by forming the shallow slit SHE in a self-aligned manner using the opening A1 of the guide insulating film 21, even when the columnar bodies CL1 are inclined in the replacement process, the shallow slit SHE can be formed at a desired position. As a result, the distances D1 and D2 can be secured, thereby preventing the defect of the drain-side select gates SGD.

Second Embodiment

According to a second embodiment, the guide insulating film 21 further includes an opening A3. The opening A3 serves as a guide in the alignment of the contacts CH.

Other configurations according to the second embodiment may be the same as the corresponding configurations according to the first embodiment. Therefore, the same effects as those of the first embodiment can be obtained in the second embodiment.

FIGS. 15 to 21 are schematic cross-sectional views illustrating an example of a method for manufacturing the semiconductor memory device 100 according to the second embodiment.

First, as described with reference to FIG. 5, the stacked body 1a is formed, and the plurality of columnar bodies CL1 are formed in the stacked body 1a. Next, the guide insulating film 21 is formed on the stacked body 1a.

Next, the opening A1, the opening A2, and the openings A3 are formed in the guide insulating film 21 with the lithography technique and the etching technique. The opening A1 and the opening A2 may be the same as the openings A1 and A2 according to the first embodiment. The openings A3 are formed on the plurality of columnar bodies CL1 and formed in advance at the planned formation positions of the contacts CH. The opening A3 has a circular or elliptical shape, for example.

Next, a sacrificial film 61 is deposited on the guide insulating film 21. The sacrificial film 61 is filled in the openings A1 to A3. As a result, the structure illustrated in FIG. 15 may be obtained.

Figure 16:
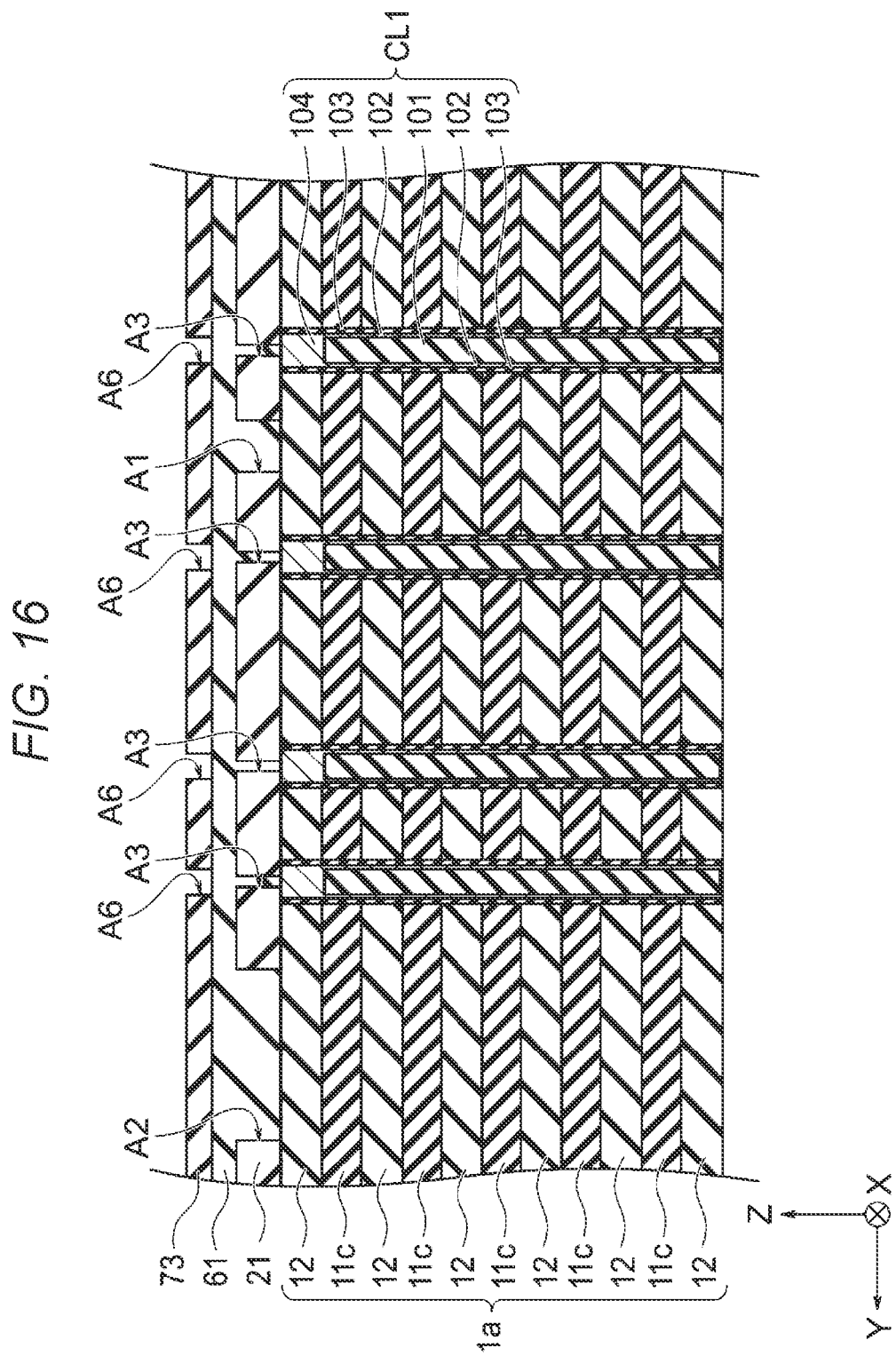
FIG. 16 is a schematic cross-sectional view illustrating, continuing from FIG. 15, the method for manufacturing a semiconductor memory device.

Next, as illustrated in FIG. 16, a photoresist film 73 is formed on the sacrificial film 61, and openings A6 are formed in the photoresist film 71 with the lithography technique. The openings A6 are formed above the openings A3 of the guide insulating film 21. The openings A6 may have, for example, circular or elliptical shape like the opening A3.

Figure 17:
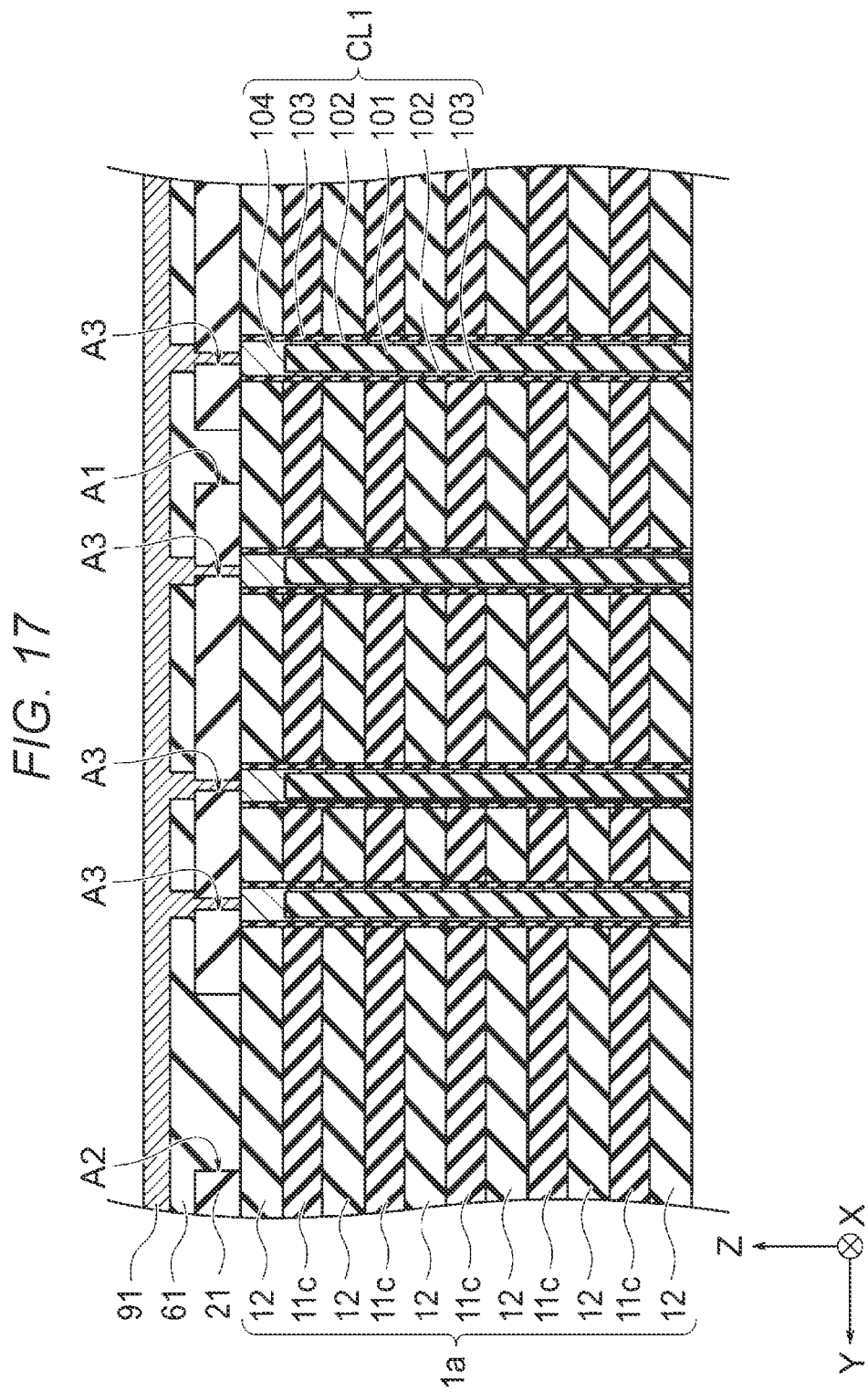
FIG. 17 is a schematic cross-sectional view illustrating, continuing from FIG. 16, the method for manufacturing a semiconductor memory device.

Next, as illustrated in FIG. 17, using the photoresist film 73 as a mask, the sacrificial film 61 in the openings A3 is removed by the etching technique. Next, a conductive film 91 is formed so as to fill the inside of the openings A3. The conductive film 91 is an example of the third conductive film. The conductive film 91 is a conductive metal such as W (tungsten), for example. The conductive film 91 is electrically connected to the columnar bodies CL1 via the openings A3.

Figure 18:
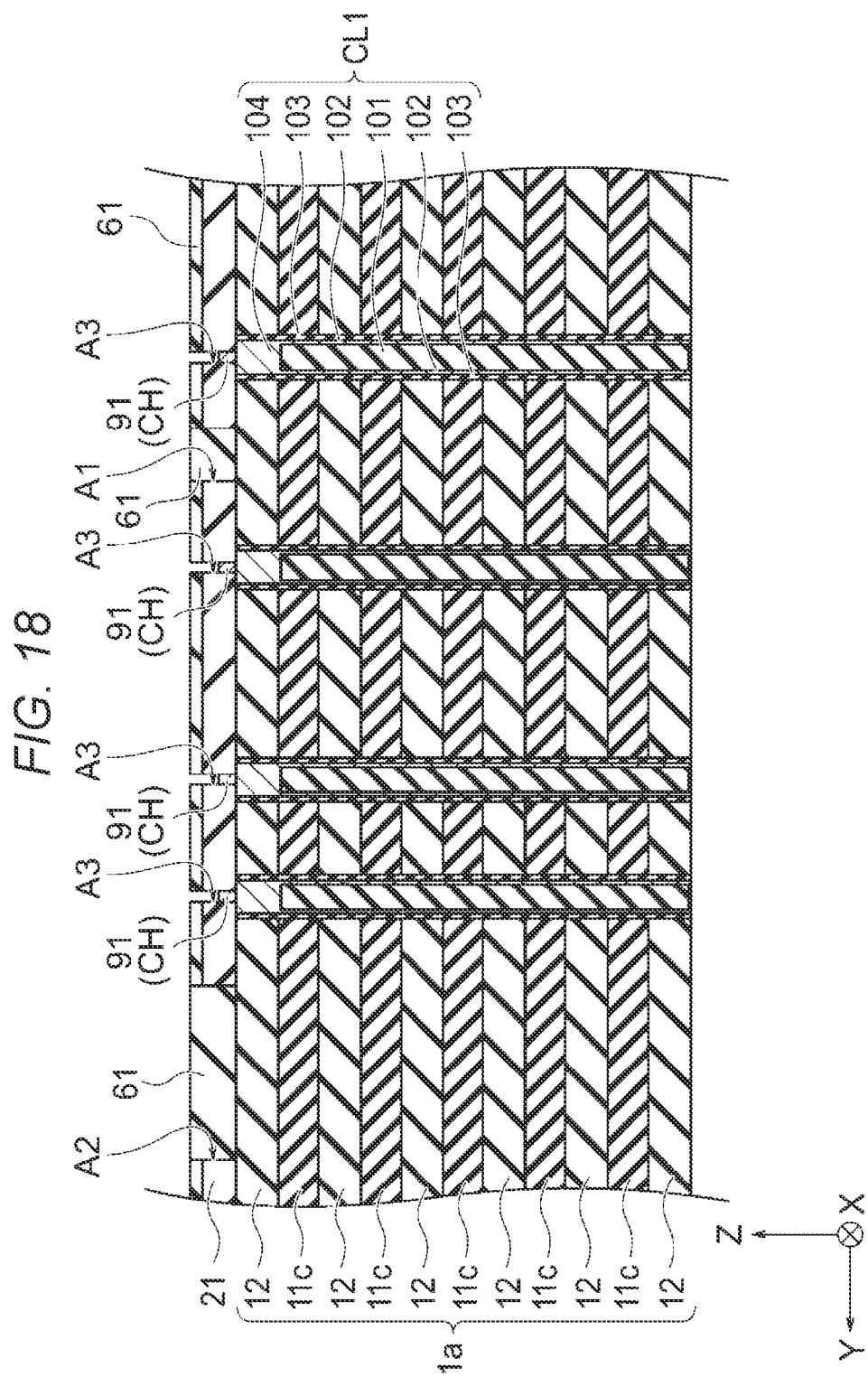
FIG. 18 is a schematic cross-sectional view illustrating, continuing from FIG. 17, the method for manufacturing a semiconductor memory device.

Next, as illustrated in FIG. 18, the conductive film 91 is polished and etched back by using a Chemical Mechanical Polishing (CMP) method and a wet etching method. As a result, the conductive film 91 on the guide insulating film 21 is removed, and the conductive film 91 is left at a lower side in the opening A3. Since the conductive film 91 serves as the contacts CH, the conductive film 91 is also referred to as the contacts CH below. As described above, the contacts CH can be formed on the columnar bodies CL1 before the replacement process. As a result, even when the stacked body 1 is inclined by the stress from the conductive film 11 due to the replacement process, the guide insulating film 21 and the contacts CH are moved together with the inclination of the stacked body 1. That is, after the replacement process, the relative positions of the guide insulating film 21 and the contacts CH with respect to the stacked body 1 remain almost unchanged. Therefore, it is possible to prevent the contacts CH from being deviated from the positions of the columnar bodies CL1.

Figure 19:
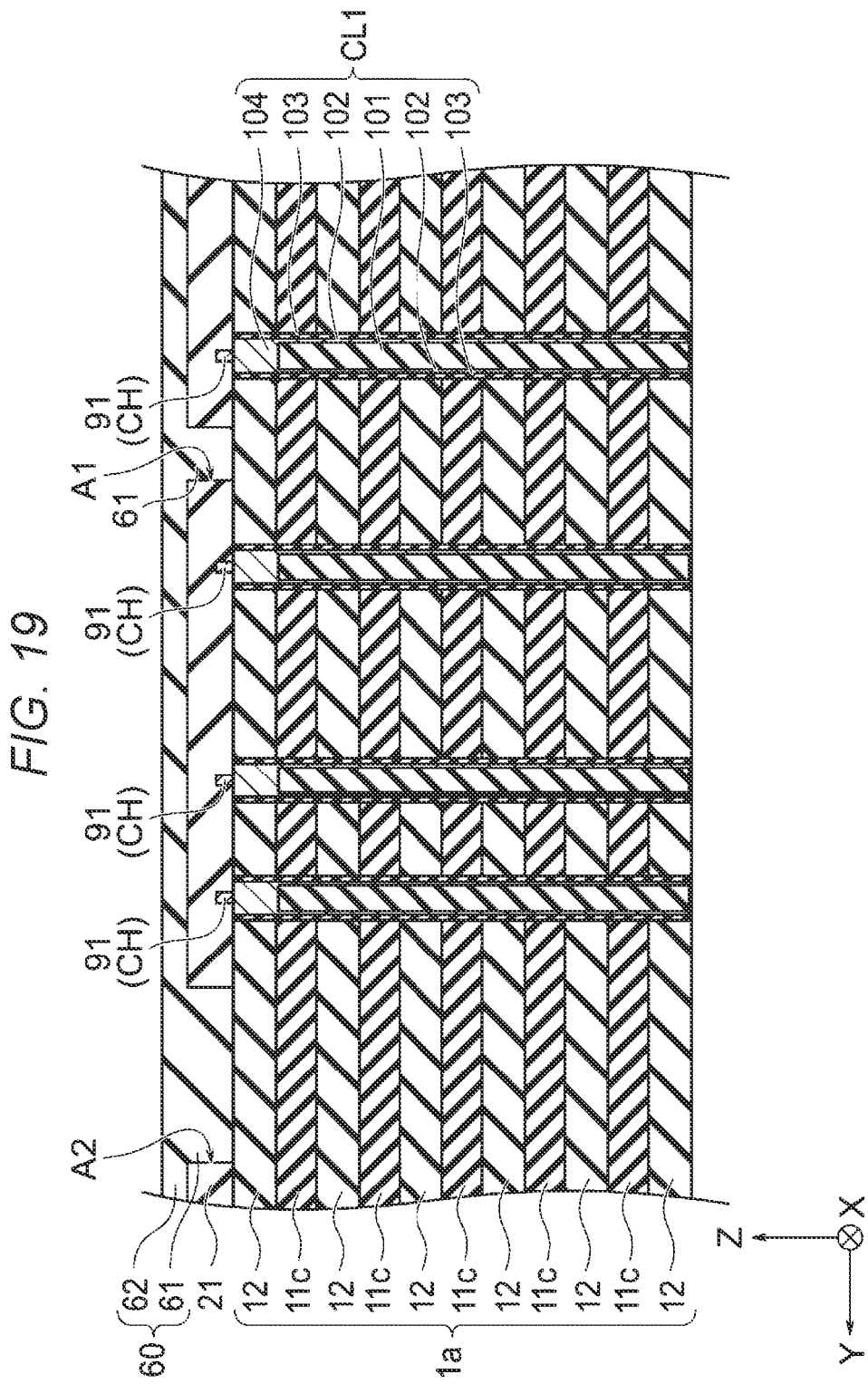
FIG. 19 is a schematic cross-sectional view illustrating, continuing from FIG. 18, the method for manufacturing a semiconductor memory device.

Next, as illustrated in FIG. 19, the same material as the guide insulating film 21 (for example, silicon nitride or aluminum oxide) is filled in the openings A3, and a sacrificial film 62 is formed on the guide insulating film 21 and the sacrificial film 61. The sacrificial film 62 may be formed of the same material as the sacrificial film 61 (for example, a silicon oxide film). The sacrificial films 61 and 62 are collectively referred to as an insulating layer 60. The insulating layer 60 is an example of the first insulating layer.

Next, through the processes described with reference to FIGS. 6 to 10, the slit ST is formed, the replacement process is performed, and the plate-shaped portion 40 is formed.

Figure 20:
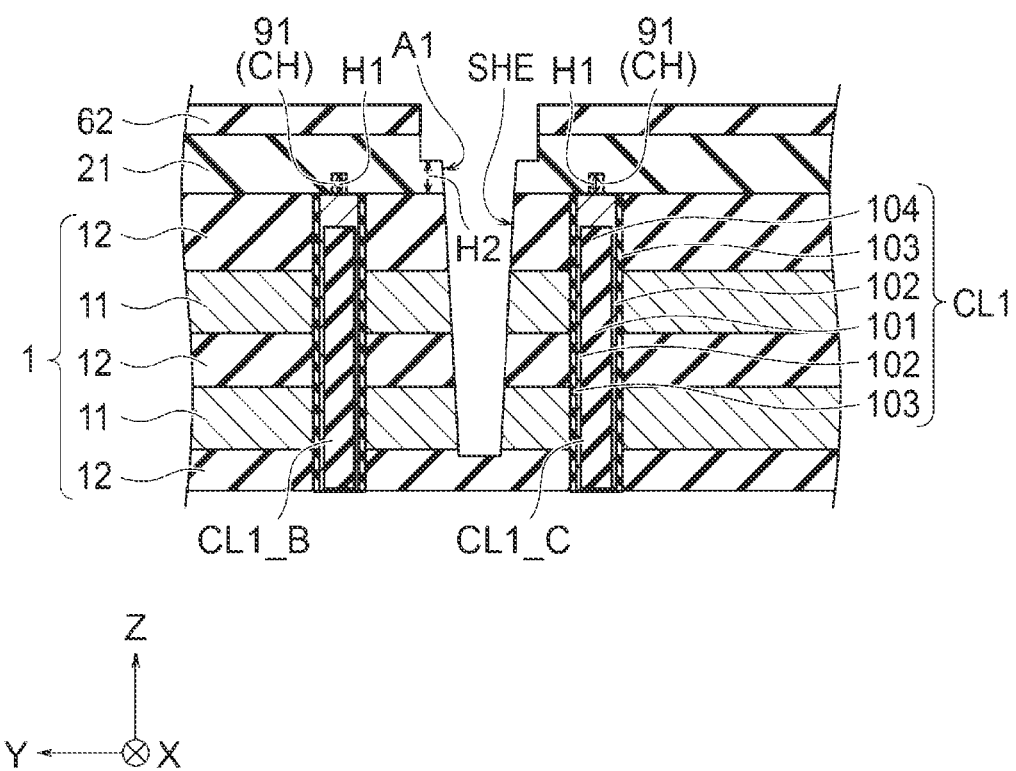
FIG. 20 is a schematic cross-sectional view illustrating a shallow slit and a structure around the same according to the second embodiment.

Hereinafter, with reference to FIG. 20, the relationship between the conductive film 91 (contacts CH) and the opening A1 will be described in detail. FIG. 20 is a cross-sectional view illustrating the shallow slit SHE and a structure around the same. A height H1 of the contact CH is lower than a height H2 to the step of the opening A1. The height H1 of the contact CH is the height from a lower surface to an upper surface of the contact CH in the Z direction. The height H2 to the step of the opening A1 is the height from a lower surface of the opening A1 to the step or the inflection point in the Z direction. As a result, even when the distance between the columnar body CL1_B or CL1_C and the shallow slit SHE is short, it is possible to prevent the contact CH from protruding from the stepped surface or the curved surface of the shallow slit SHE.

When the contact CH protrudes from the stepped surface or the curved surface of the shallow slit SHE, the via contact VY cannot be formed on the contact CH, and there is a poor electrical connection between the columnar bodies CL1 and the bit lines BL.

On the other hand, according to the second embodiment, the height H of the contact CH is formed lower than the height H2 to the lower stage of the opening A1 in advance, thereby preventing the contact CH from protruding into the shallow slit SHE. As a result, the bit lines BL and the columnar bodies CL1 can be electrically connected via the contacts CH.

Figure 21:
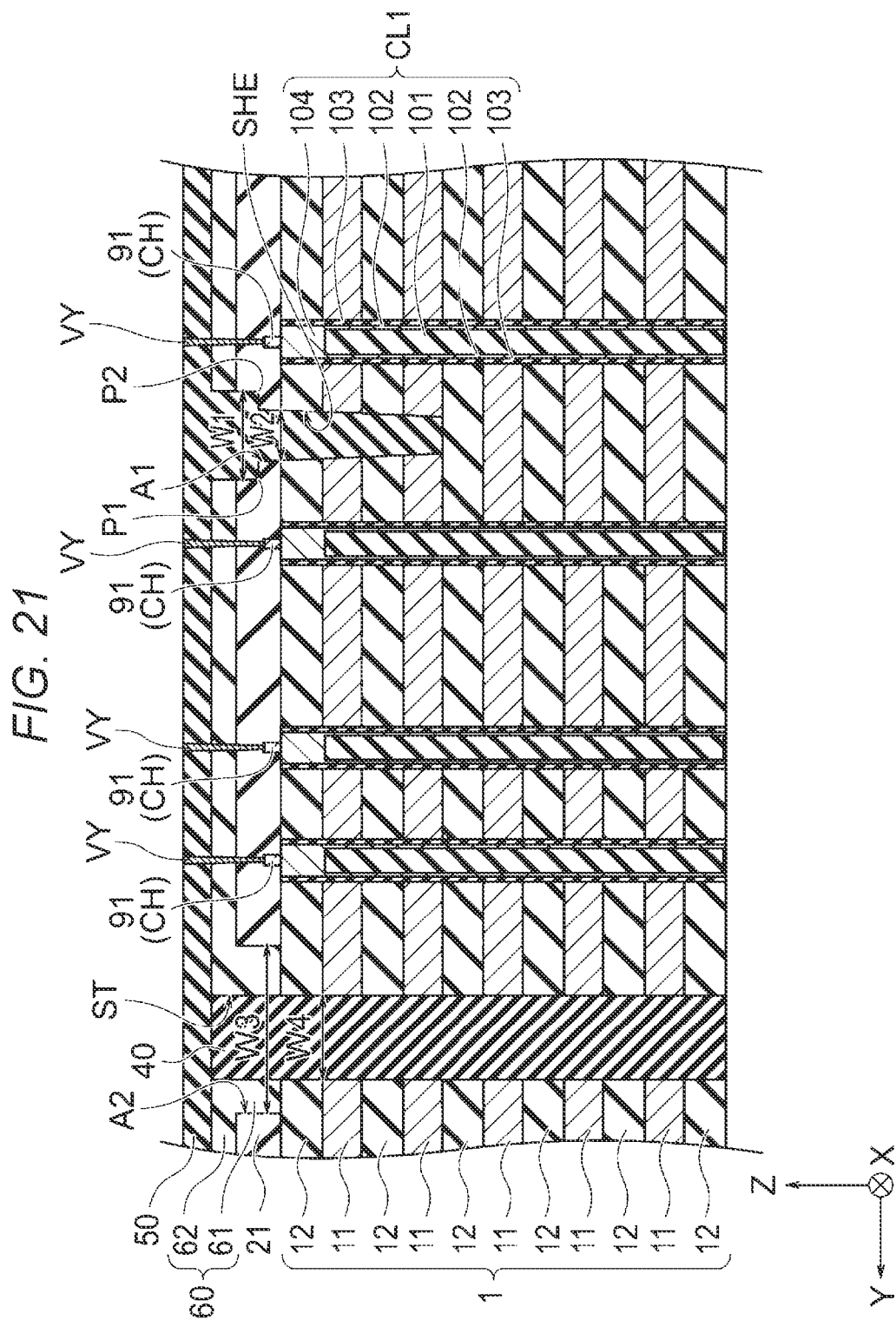
FIG. 21 is a schematic cross-sectional view illustrating, continuing from FIG. 19, the method for manufacturing a semiconductor memory device.

Next, the insulator 50 is filled in the shallow slit SHE as in the first embodiment. Next, as illustrated in FIG. 21, the insulator 50 is processed with the lithography technique and the etching technique to form via holes at the positions of the contacts CH. The via holes are formed to a depth reaching the upper surfaces of the contacts CH, and may be formed in a substantially oblate shape or a substantially elliptical shape in a plan view from the Z direction. Next, the via holes are filled with titanium (Ti), titanium nitride (TiN) or tungsten (W), and this is polished by the Chemical Mechanical Polishing (CMP) method. As a result, via contacts VY are formed. In the plan view seen from the Z direction, the via contacts VY are in the contacts CH so as not to deviate out of the contacts CH.

Then, as in the first embodiment, a plurality of bit lines BL are provided above the contacts VY to be electrically connected to the contacts VY. Then, the other multilayer wiring structure or the like is formed, and the semiconductor memory device 100 according to the second embodiment is completed.

As described above, according to the second embodiment, the guide insulating film 21 includes not only the openings A1 and A2 but also the openings A3 for forming the contacts CH. As a result, the contacts CH can be formed on the columnar bodies CL1 in advance before the replacement process. Therefore, even when the stacked body 1 is inclined by the replacement process, the contacts CH are moved with the inclination of the stacked body 1, and the relative positions of the contacts CH with respect to the stacked body 1 are not changed. Therefore, the contacts CH can maintain the state of being connected to the columnar bodies CL1 and can maintain the connection between the bit lines and the columnar bodies CL1.

Other configurations according to the second embodiment may be the same as the corresponding configurations according to the first embodiment. Therefore, according to the second embodiment, the same effect as that of the first embodiment can be achieved.

Third Embodiment

FIGS. 22 to 29B are schematic cross-sectional views illustrating a method for manufacturing the semiconductor memory device 100 according to a third embodiment. In the second embodiment, the contacts CH are formed in advance before the replacement process. Meanwhile, according to the third embodiment, the openings A3 are formed in the guide insulating film 21 before the replacement process, and the contacts CH are formed by using the openings A3 of the guide insulating film 21 as a guide after the replacement process. At this time, the contacts CH and the shallow slit SHE are formed at the same time. The configuration and the other manufacturing methods of the third embodiment may be the same as the configuration and manufacturing method of the second embodiment.

Figure 22:
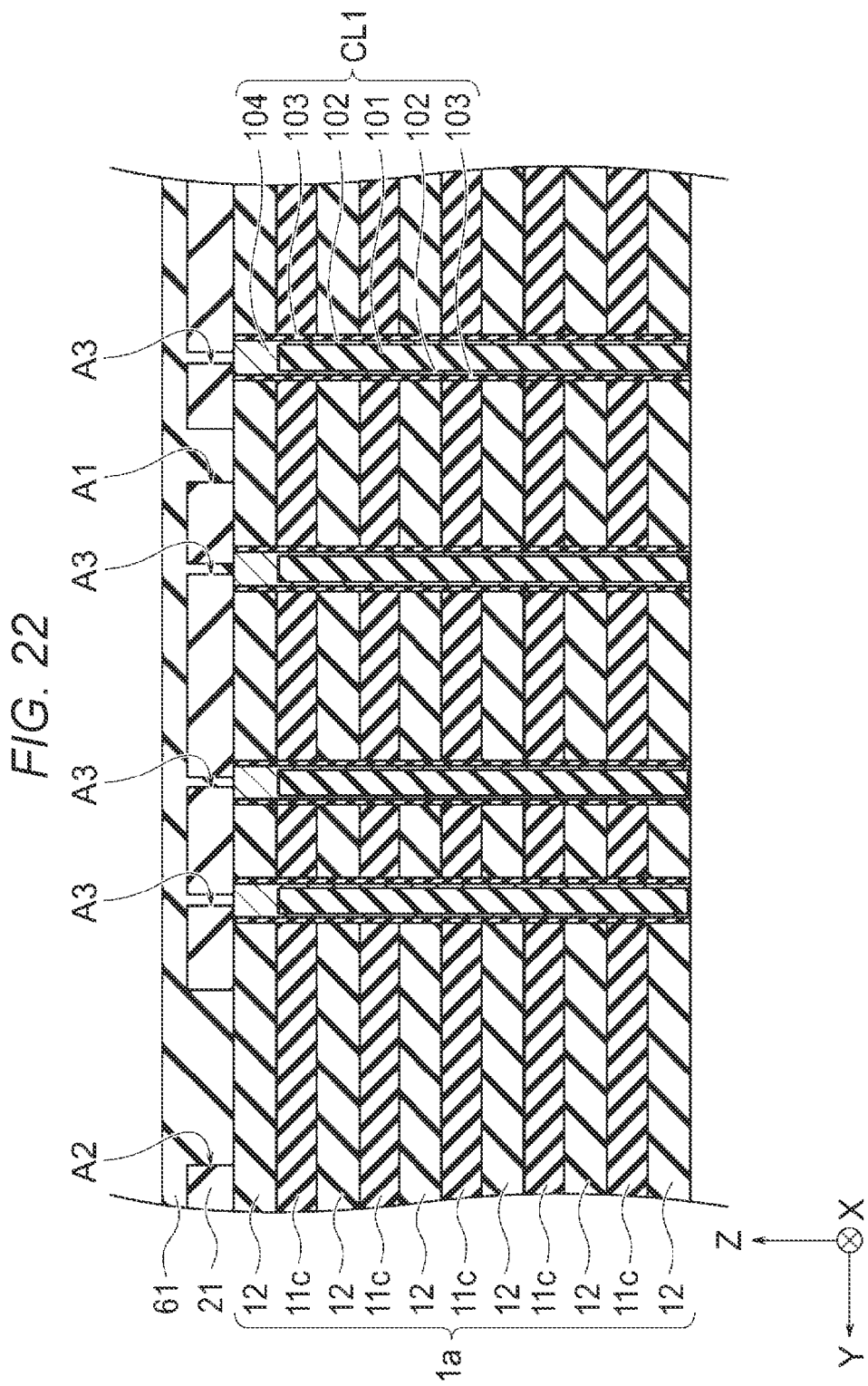
FIG. 22 is a schematic cross-sectional view illustrating a method for manufacturing a semiconductor memory device according to a third embodiment.

First, as illustrated in FIG. 22, the stacked body 1a is formed and the plurality of columnar bodies CL1 are formed in the stacked body 1a as in the second embodiment. Next, the guide insulating film 21 is formed on the stacked body 1a.

Next, the opening A1, the opening A2, and the openings A3 are formed in the guide insulating film 21 with the lithography technique and the etching technique. The openings A1 to A3 may be the same as the openings A1 to A3 according to the second embodiment.

Next, the sacrificial film 61 is deposited on the guide insulating film 21. The sacrificial film 61 is filled in the openings A1 to A3. As a result, the structure illustrated in FIG. 22 may be obtained.

Next, through the processes described with reference to FIGS. 6 to 8, the slit ST is formed, the replacement process is performed, and the plate-shaped portion 40 is formed.

Figure 23:
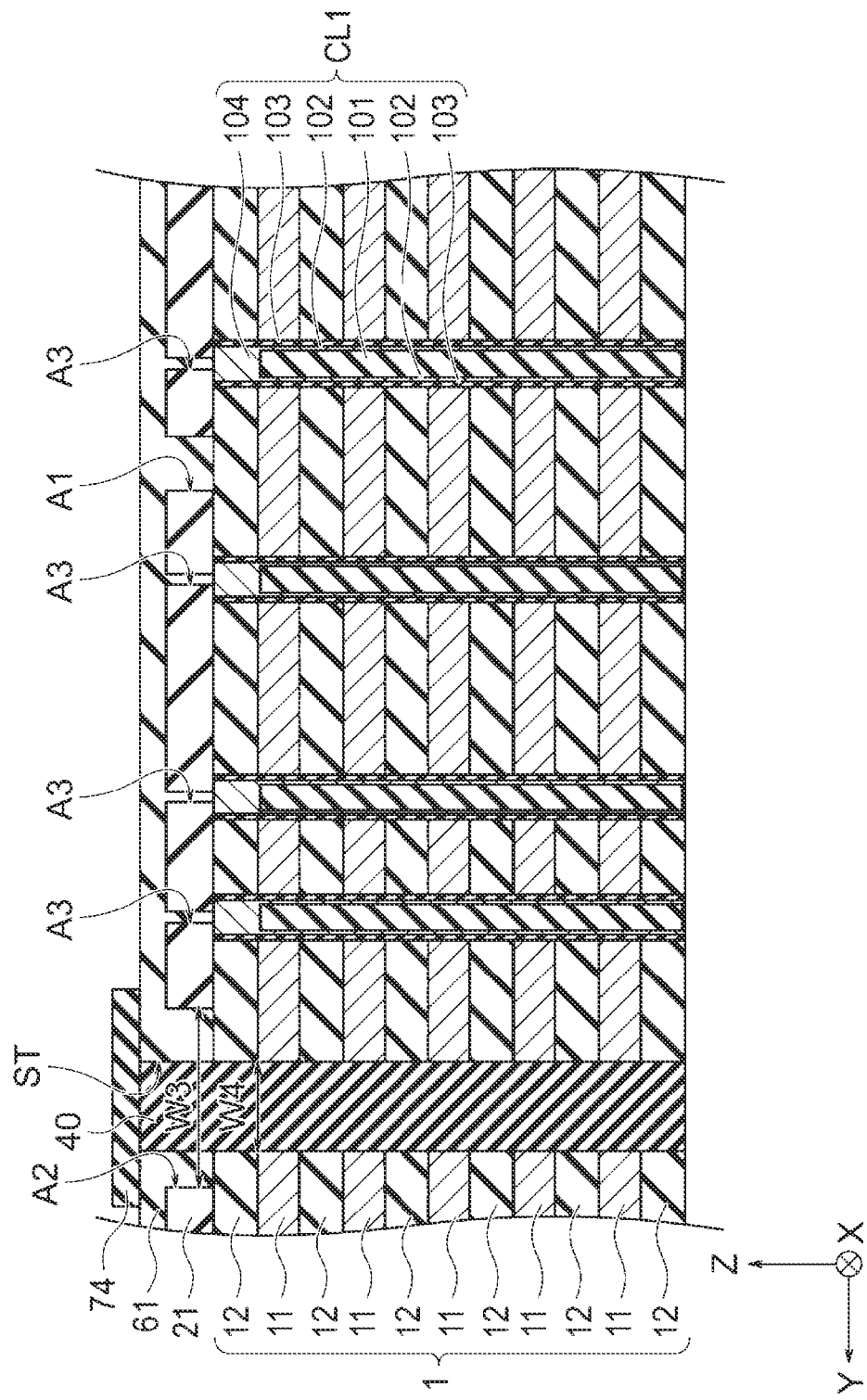
FIG. 23 is a schematic cross-sectional view illustrating, continuing from FIG. 22, the method for manufacturing a semiconductor memory device.

Next, as illustrated in FIG. 23, a photoresist film 74 is formed on the sacrificial film 61 using the lithography technique. The photoresist film 74 is patterned so as to cover the plate-shaped portion 40, and end portions of the sacrificial film 61 and the guide insulating film 21 on both sides of the plate-shaped portion 40. The photoresist film 74 is formed wider than the width W3 and covers the opening A2 of the guide insulating film 21, but does not cover the openings A1 and A3.

Figure 24:
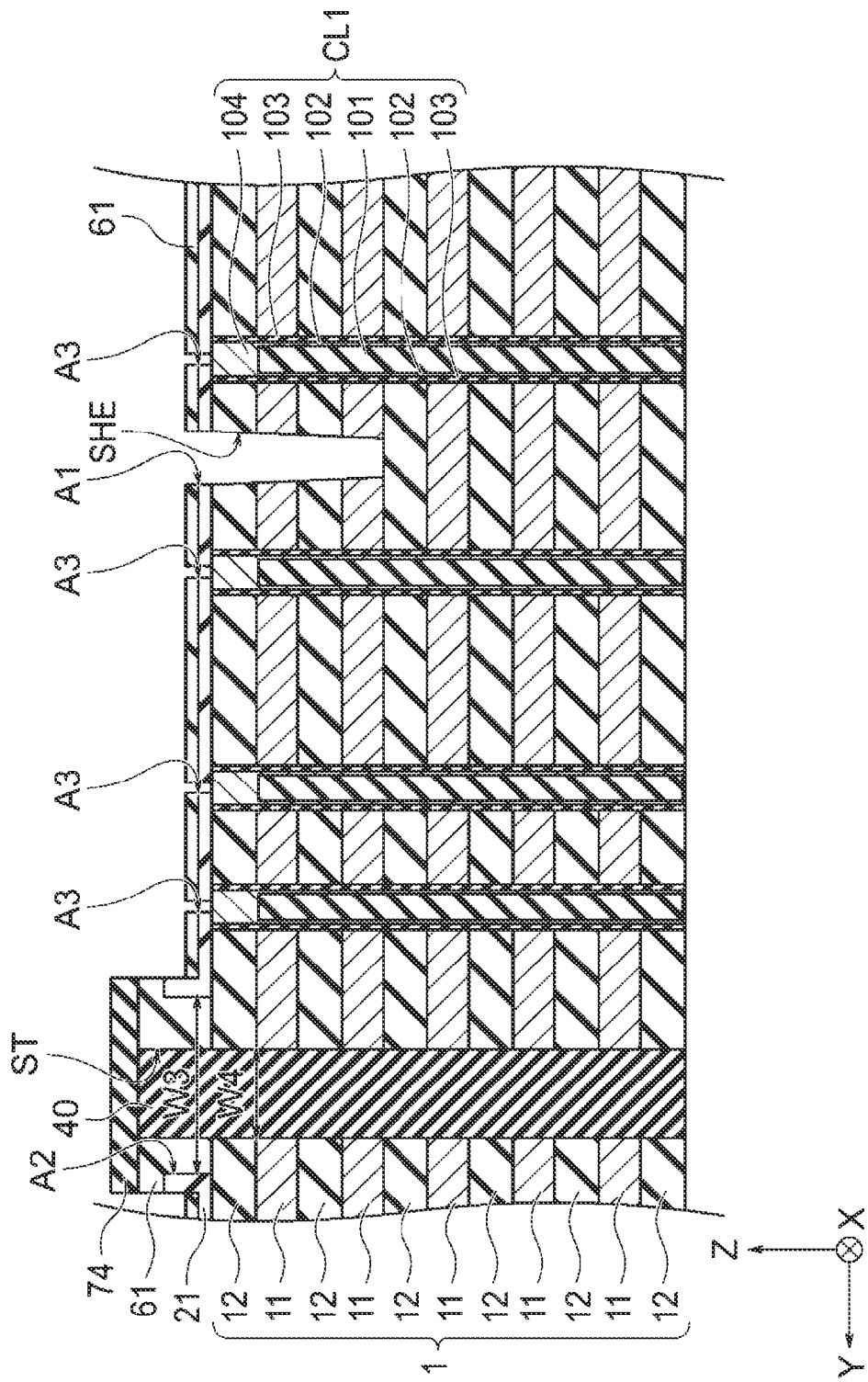
FIG. 24 is a schematic cross-sectional view illustrating, continuing from FIG. 23, the method for manufacturing a semiconductor memory device.

Next, as illustrated in FIG. 24, using the photoresist film 74 and the guide insulating film 21 as masks, the sacrificial film 61 filled in the opening A1 and the openings A3 is removed by the etching technique. At this time, an upper portion of the guide insulating film 21 is partially etched. Further, using the guide insulating film 21 as a mask, a shallow slit SHE penetrating the conductive films 11 in the upper-layer portion of the stacked body 1 is formed. In addition, the sacrificial film 61 that remains on the guide insulating film 21 in this process is an example of the first insulating portion.

Figure 25:
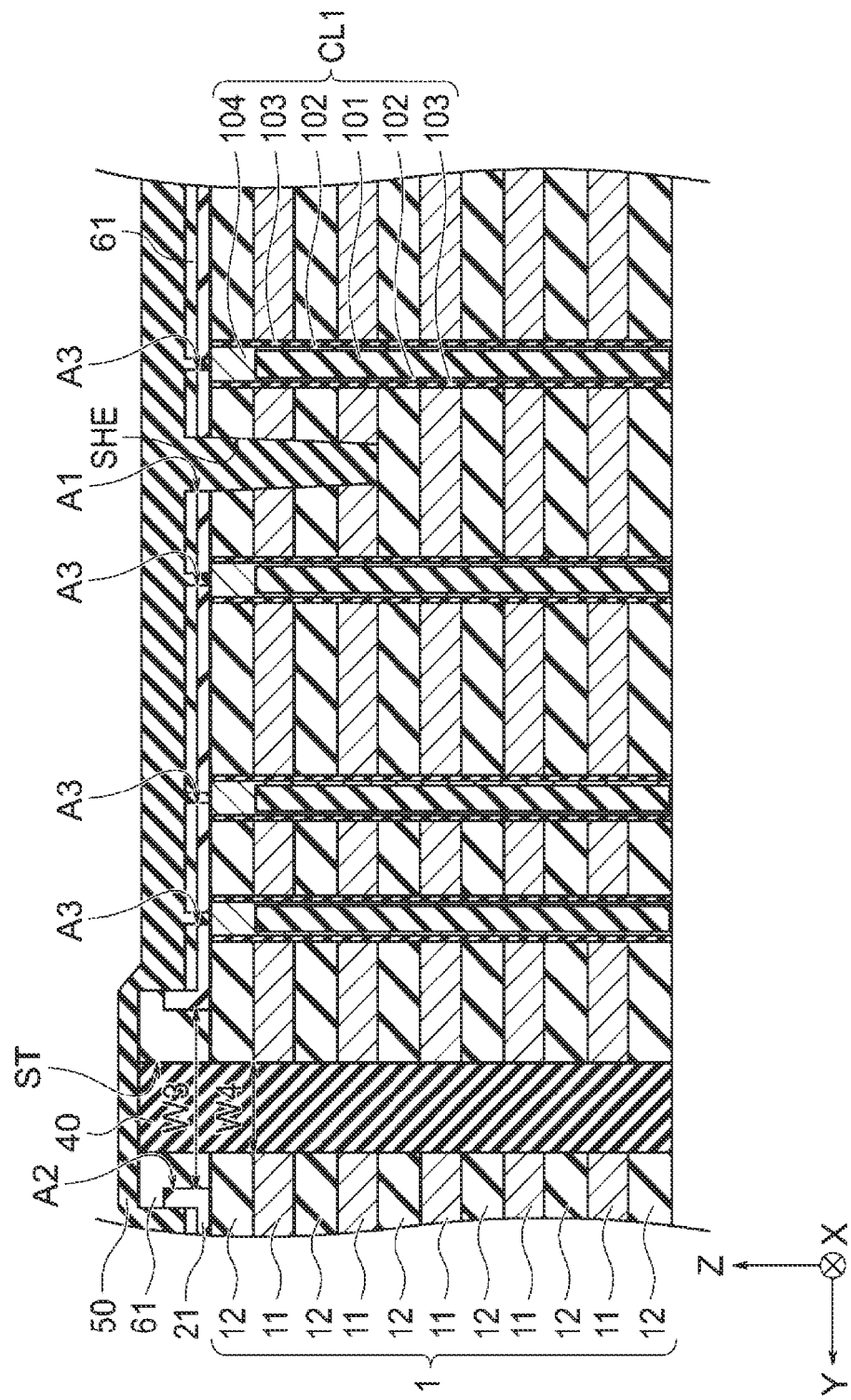
FIG. 25 is a schematic cross-sectional view illustrating, continuing from FIG. 24, the method for manufacturing a semiconductor memory device.

Next, as illustrated in FIG. 25, the insulator 50 is formed on the sacrificial film 61. At this time, the insulator 50 is filled in the shallow slit SHE and the openings A3. For the insulator 50, a silicon oxide is used, for example.

Figure 26:
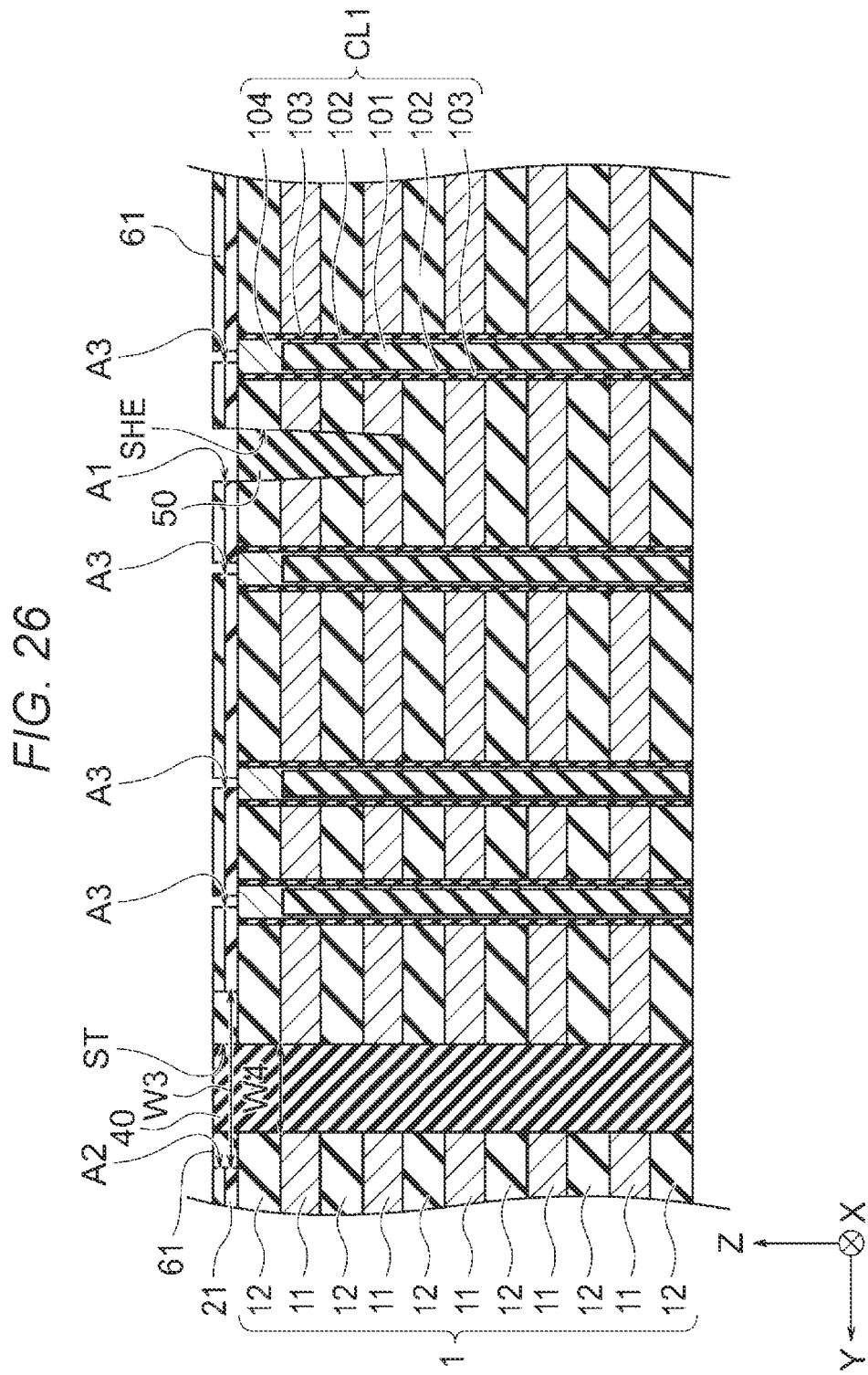
FIG. 26 is a schematic cross-sectional view illustrating, continuing from FIG. 25, the method for manufacturing a semiconductor memory device.

Next, as illustrated in FIG. 26, the insulator 50 is etched back to remove the other insulator 50 while leaving the insulator 50 in the shallow slit SH. At this time, the insulator 50 filled in the openings A3 is also removed. In addition, the insulator 50 on an upper side of the shallow slit SHE may be removed to the extent that the conductive film 11 on the uppermost layer is not exposed.

Figure 27:
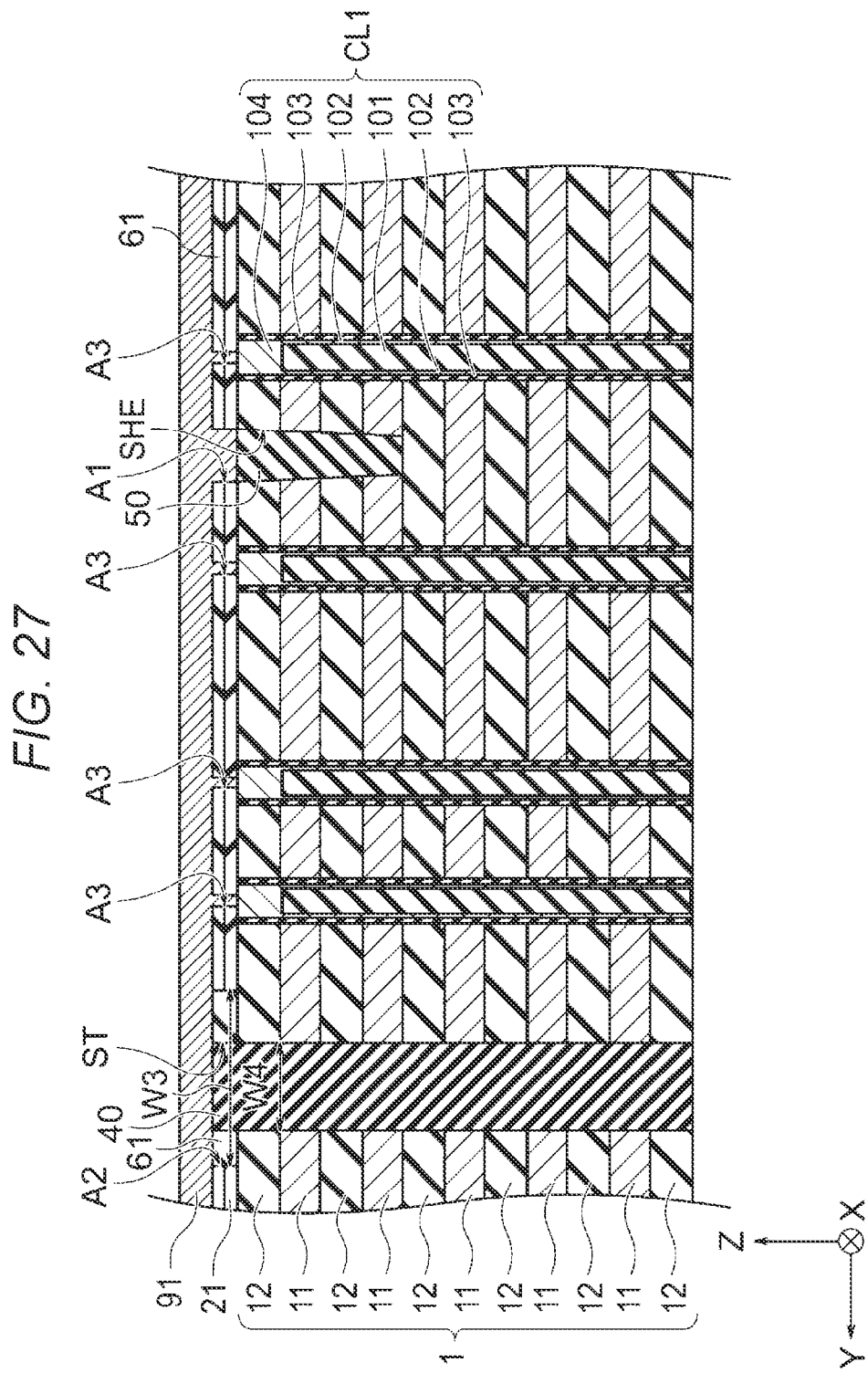
FIG. 27 is a schematic cross-sectional view illustrating, continuing from FIG. 26, the method for manufacturing a semiconductor memory device.

Next, as illustrated in FIG. 27, the conductive film 91 is formed on the guide insulating film 21. At this time, the conductive film 91 is filled on top of the openings A3 and the opening A1. The conductive film 91 is a conductive metal such as tungsten, for example. The conductive film 91 is electrically connected to the columnar bodies CL1 via the openings A3. The conductive film 91 is also filled in the space (opening A1) above the shallow slit SHE from which the insulator 50 was removed.

Figure 28:
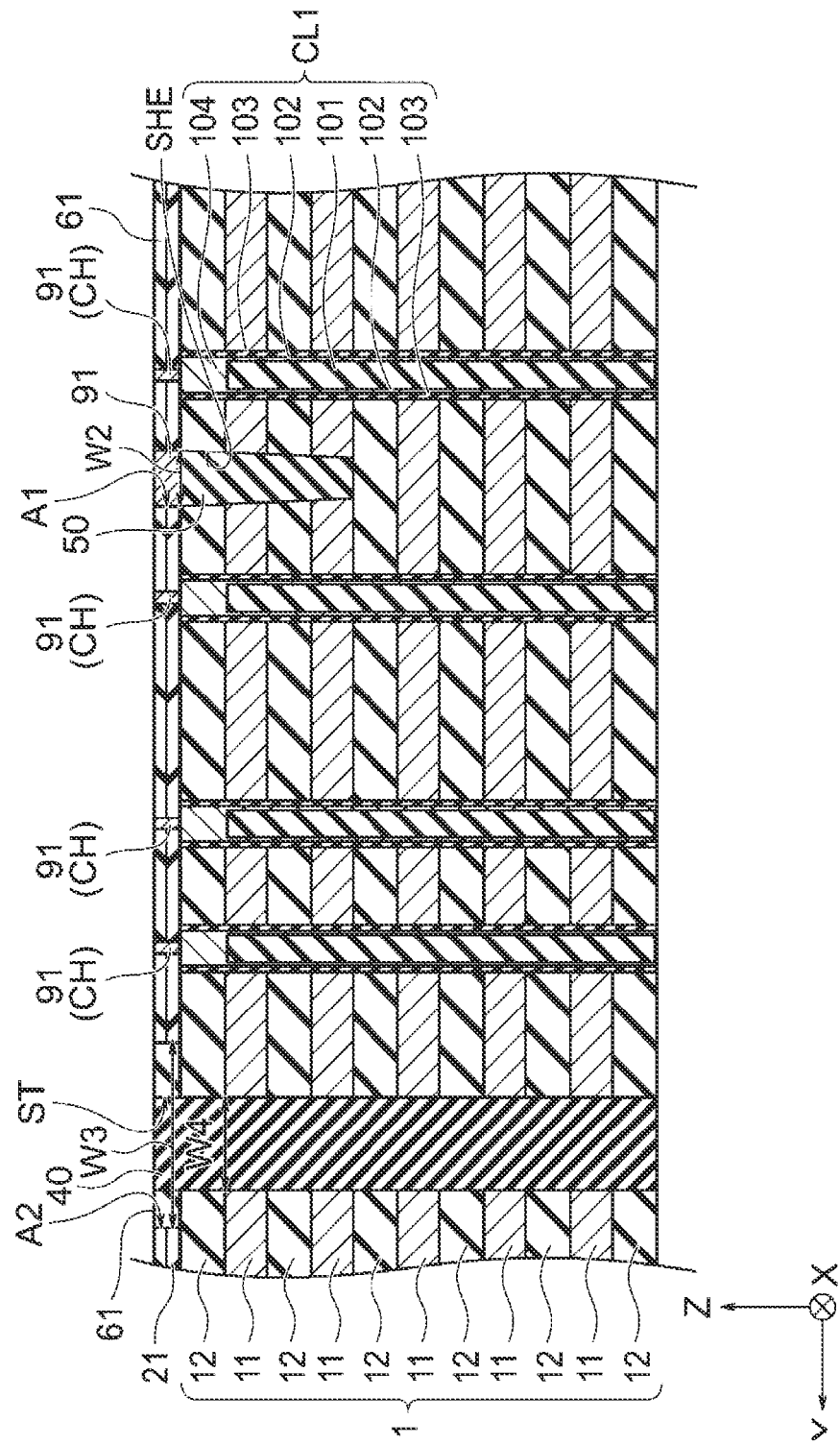
FIG. 28 is a schematic cross-sectional view illustrating, continuing from FIG. 27, the method for manufacturing a semiconductor memory device.

Next, as illustrated in FIG. 28, the conductive film 91 is polished by the CMP method. As a result, the conductive film 91 filled in the openings A3 and the opening A1 on the shallow slit SHE is left, and the second insulating film and the conductive film 91 on the opening A2 are removed. The conductive film 91 is an example of the second conductive film.

Figure 29A:
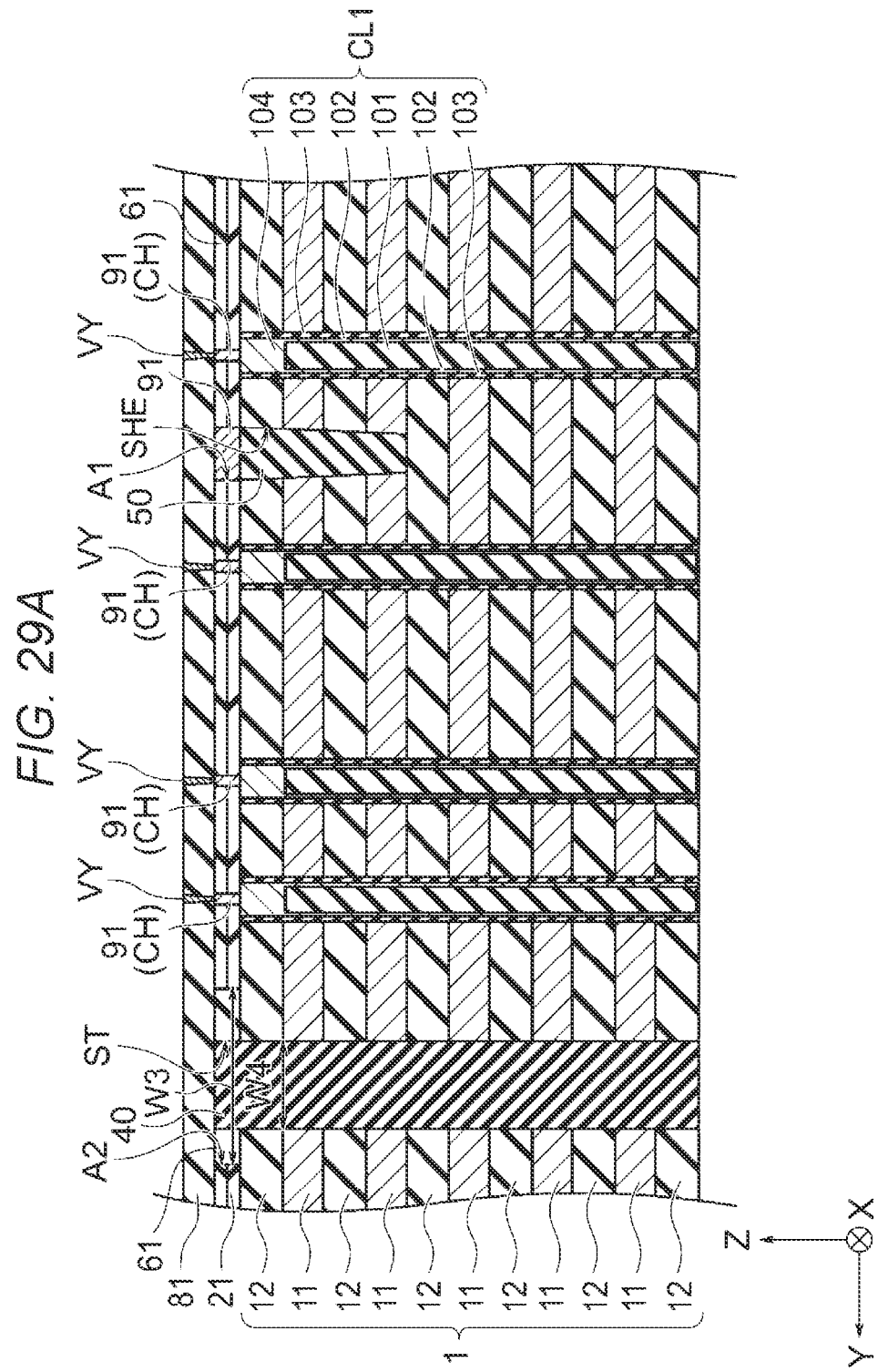
FIG. 29A is a schematic cross-sectional view illustrating, continuing from FIG. 28, the method for manufacturing a semiconductor memory device.

Next, as illustrated in FIG. 29A, likewise the first embodiment, the interlayer insulating film 81 is formed on the guide insulating film 21 and the contacts VY are formed on the interlayer insulating film 81.

Figure 29B:
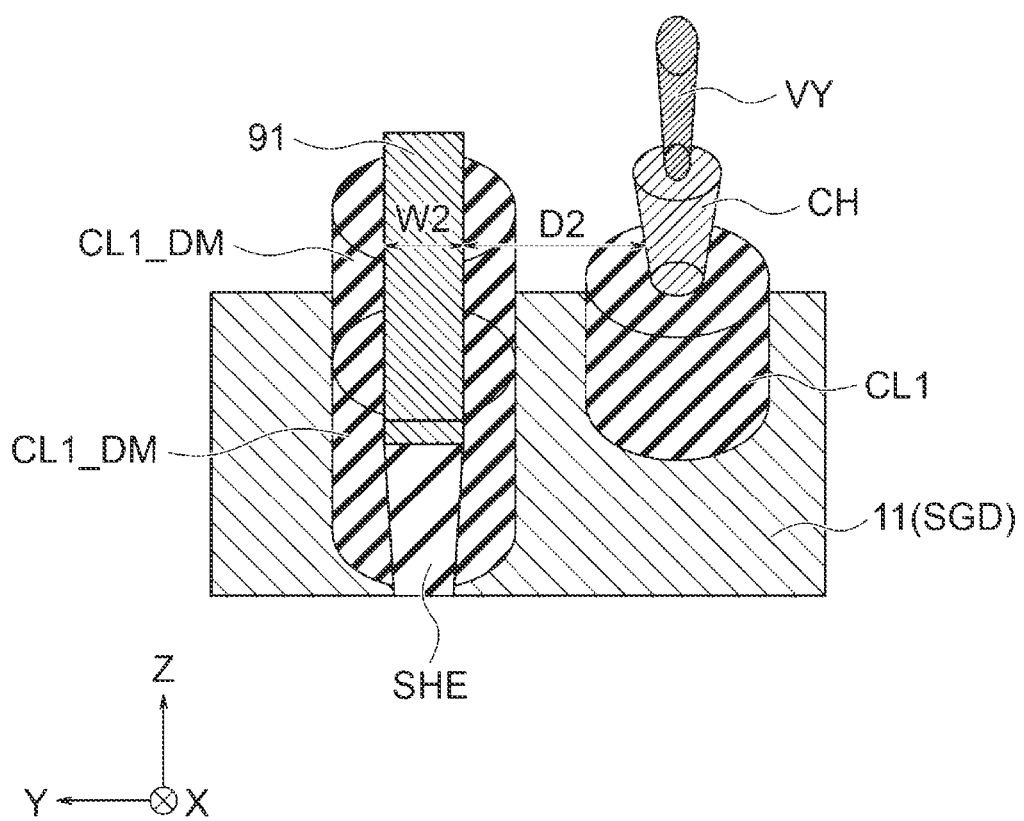
FIG. 29B is a schematic perspective view illustrating a configuration example of a shallow slit and a contact according to the third embodiment.

FIG. 29B is a perspective view illustrating a configuration example of the shallow slit SHE and the contacts CH. The conductive film 91 is formed on the shallow slit SHE. As described above, the columnar bodies CL1 under the shallow slit SHE are the dummy memory holes (columnar body CL1_DM). Further, although the conductive film 91 is provided on the shallow slit SHE, it does not function electrically.

According to the first embodiment, the first film is the insulator 50 in the shallow slit SHE. However, according to the third embodiment, the first film may be the conductive film 91 on the insulator 50. In this case, the conductive film 91 may be tungsten, for example.

The distance D2 between the conductive film 91 and the columnar bodies CL1 is greater than the width W2 of the conductive film 91. Further, as illustrated in FIG. 29A, the guide insulating film 21 is present between the conductive film 91 and the contacts CH. Therefore, the parasitic capacitance of the conductive film 91 on the shallow slit SHE has almost no effect on the contacts CH and VY.

Then, as in the first embodiment, a plurality of bit lines BL are provided above the contacts VY to be electrically connected to the contacts VY. Further, the other multilayer wiring structure or the like is formed, and the semiconductor memory device 100 according to the third embodiment is completed.

As described above, according to the third embodiment, the guide insulating film 21 includes not only the openings A1 and A2 but also the openings A3 for forming the contacts CH. As a result, even when the stacked body 1 is inclined by the replacement process, the guide insulating film 21 and the openings A3 are moved with the inclination of the stacked body 1, and the relative positions of the openings A3 with respect to the stacked body 1 are not changed. Therefore, when the contacts CH are formed after the replacement process, the openings A3 may be an index of an appropriate position of the contacts CH. That is, by forming the contacts CH in a self-aligned manner using the openings A3 of the guide insulating film 21, even when the columnar bodies CL1 are inclined in the replacement process, the contacts CH can be formed on the columnar bodies CL1. As a result, it is possible to prevent the poor connection between the columnar body CL1 and the bit line BL.

Other configurations according to the third embodiment may be the same as the corresponding configurations according to the second embodiment. Therefore, according to the third embodiment, the same effect as that of the second embodiment can be achieved.

Figure 30:
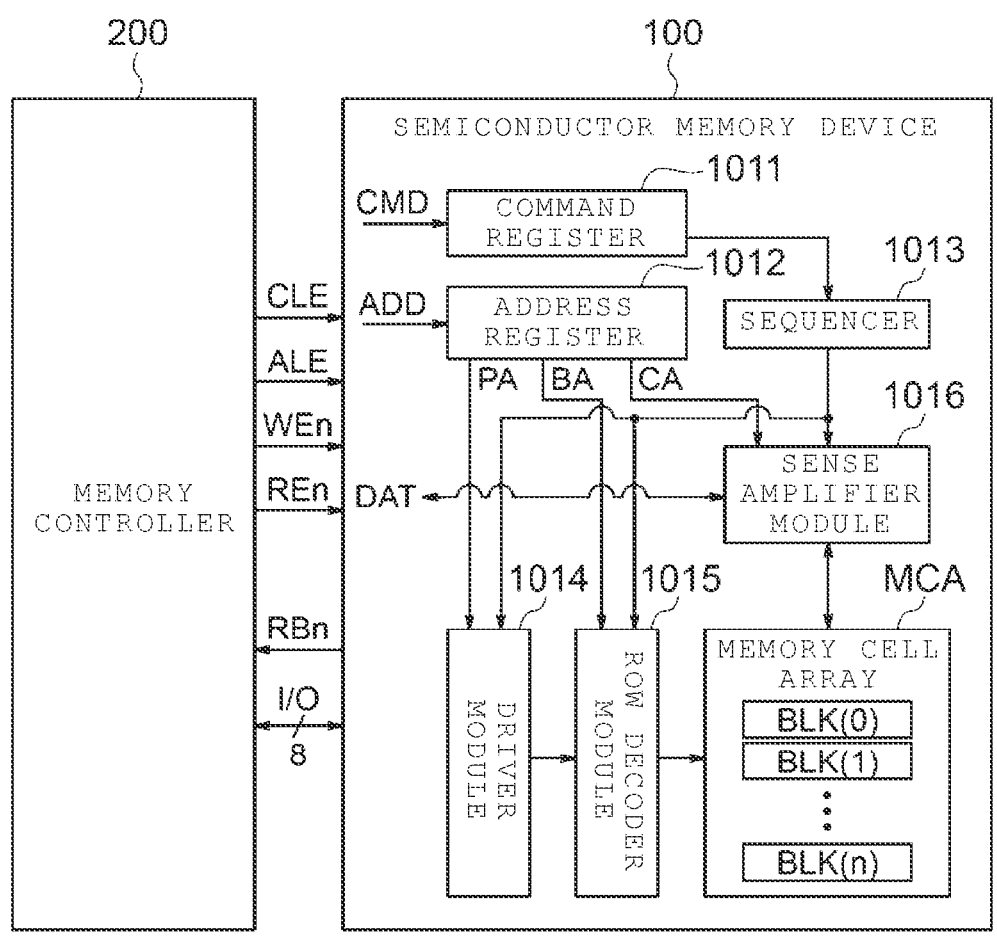
FIG. 30 is a block diagram illustrating a configuration example of a semiconductor memory device to which any of the above embodiments is applied.

FIG. 30 is a block diagram illustrating a configuration example of a semiconductor memory device to which any of the embodiments described above is applied. The semiconductor memory device 100 is a NAND flash memory capable of storing data in a non-volatile manner, and is controlled by an external memory controller 1002. Communication between the semiconductor memory device 100 and the memory controller 1002 supports the NAND interface standard, for example.

As illustrated in FIG. 30, the semiconductor memory device 100 includes a memory cell array MCA, a command register 1011, an address register 1012, a sequencer 1013, a driver module 1014, a row decoder module 1015, and a sense amplifier module 1016, for example.

The memory cell array MCA includes a plurality of blocks BLK(0) to BLK(n) (n is an integer greater than or equal to 1). The block BLK is a set of a plurality of memory cells capable of storing data non-volatilely, and is used as a data erasing unit, for example. Further, the memory cell array MCA includes a plurality of bit lines and a plurality of word lines. Each memory cell is associated with one bit line and one word line, for example. The detailed configuration of the memory cell array MCA will be described below.

The command register 1011 stores a command CMD received by the semiconductor memory device 100 from a memory controller 200. The command CMD includes instructions for causing the sequencer 1013 to execute a read operation, a write operation, an erasing operation, and the like, for example.

The address register 1012 stores address information ADD received by the semiconductor memory device 100 from the memory controller 1002. The address information ADD includes a block address BAdd, a page address PAdd, and a column address CAdd, for example. For example, the block address BAdd, the page address PAdd, and the column address CAdd are used to select the block BLK, the word line, and the bit line, respectively.

The sequencer 1013 controls the overall operation of the semiconductor memory device 100. For example, the sequencer 1013 controls the driver module 1014, the row decoder module 1015, the sense amplifier module 1016, and the like based on the command CMD stored in the command register 1011 to execute the read operation, the write operation, the erasing operation, and the like.

The driver module 1014 generates a voltage for use in the read operation, the write operation, the erasing operation, and the like. Then, the driver module 1014 applies the generated voltage to a signal line corresponding to the selected word line based on the page address PAdd stored in the address register 1012, for example.

The row decoder module 1015 includes a plurality of row decoders RD. The row decoder RD selects one block BLK in the corresponding memory cell array MCA based on the block address BAdd stored in the address register 1012. Then, for example, the row decoder RD transfers the voltage applied to the signal line corresponding to the selected word line to the selected word line in the selected block BLK.

In the write operation, the sense amplifier module 1016 applies a desired voltage to each bit line according to write data DAT received from the memory controller 200. Further, in the read operation, the sense amplifier module 1016 determines the data stored in the memory cell based on the voltage of the bit line, and transfers the determination result to the memory controller 200 as read data DAT.

The semiconductor memory device 100 and the memory controller 200 described above may be combined with each other to form one semiconductor device. Examples of such a semiconductor device include a memory card such as an SD™ card, a Solid State Drive (SSD), and the like.

Figure 31:
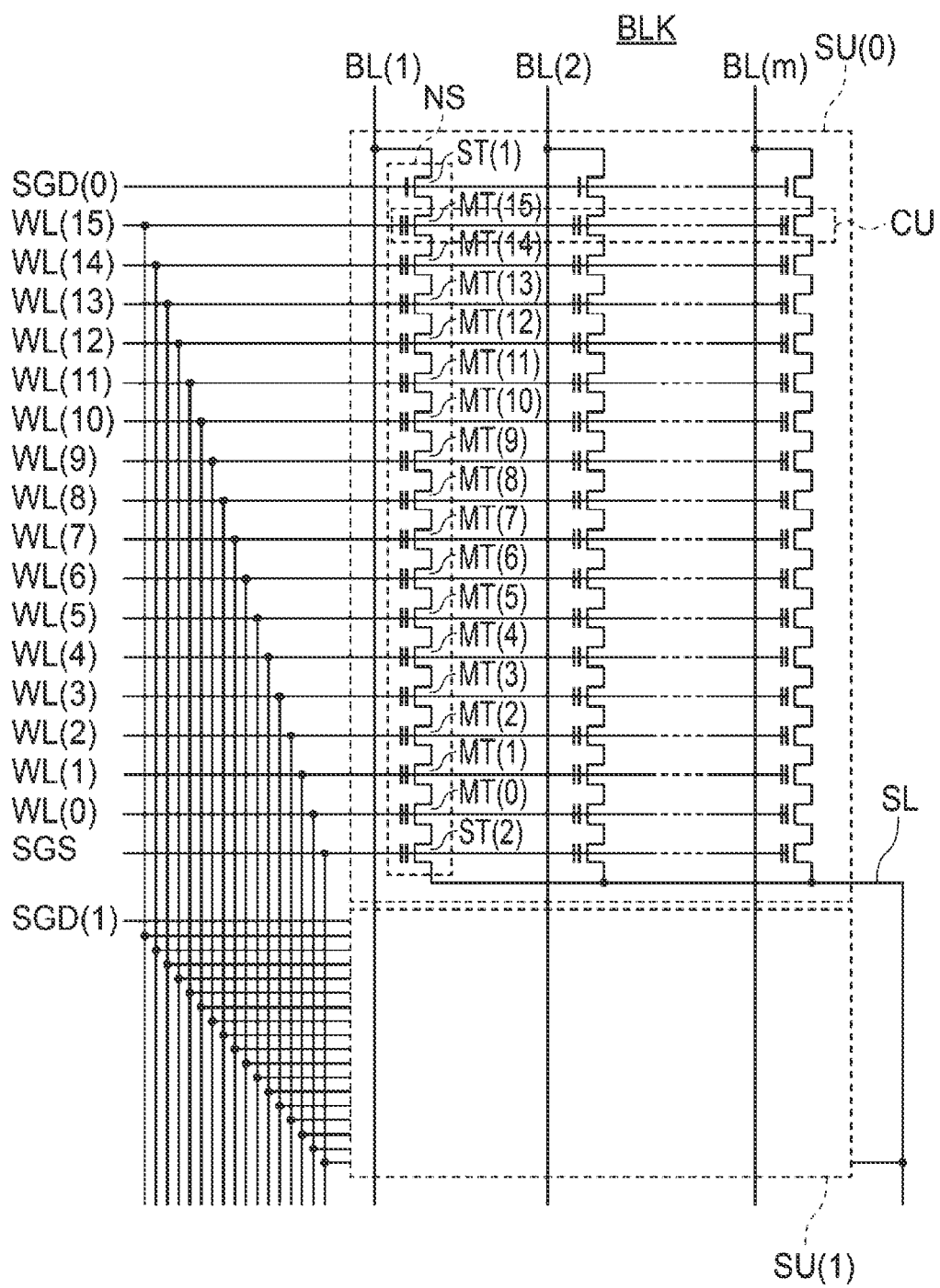
FIG. 31 is a circuit diagram illustrating an example of a circuit configuration of a memory cell array.

FIG. 31 is a circuit diagram illustrating an example of a circuit configuration of the memory cell array MCA. One block BLK out of a plurality of blocks BLK provided in the memory cell array MCA is extracted. As illustrated in FIG. 31, the block BLK includes a plurality of string units SU(0) to SU(k) (k is an integer greater than or equal to 1).

Each string unit SU includes a plurality of NAND strings NS associated with bit lines BL(0) to BL(m) (m is an integer greater than or equal to 1). Each NAND string NS includes memory cell transistors MT(0) to MT(15), and select transistors ST(1) and ST(2), for example. The memory cell transistor MT includes a control gate and a charge storage layer to store data non-volatilely. Each of the select transistors ST(1) and ST(2) is used to select the string unit SU during various operations.

In each NAND string NS, the memory cell transistors MT(0) to MT(15) are connected in series. The drain of the select transistor ST(1) is connected to the associated bit line BL, and the source of the select transistor ST(1) is connected to one end of the memory cell transistors MT(0) to MT(15) connected in series. The drain of the select transistor ST(2) is connected to the other end of the memory cell transistors MT(0) to MT(15) connected in series. The source of the select transistor ST(2) is connected to the source line SL.

In the same block BLK, the control gates of the memory cell transistors MT(0) to MT(15) are commonly connected to the respective word lines WL(0) to WL(7). The gates of the respective select transistors ST(1) in the string units SU(0) to SU(k) are commonly connected to the respective select gate lines SGD(0) to SGD(k). The gate of the select transistor ST(2) is commonly connected to the select gate line SGS.

In the circuit configuration of the memory cell array MCA described above, the bit lines BL are shared with the NAND string NS that is assigned with the same column address in each string unit SU. The source line SL is shared among the plurality of blocks BLK, for example.

A set of a plurality of memory cell transistors MT connected to a common word line WL in one string unit SU is referred to as a cell unit CU, for example. For example, the memory capacity of the cell unit CU including the memory cell transistors MT, each of which stores 1-bit data, is defined as "1 page data". The cell unit CU may include a memory capacity of 2 page data or more according to the number of bits of data stored in the memory cell transistors MT.

The memory cell array MCA of the semiconductor memory device 100 according to the embodiment described above is not limited to the circuit configuration described above. For example, the number of memory cell transistors MT and the select transistors ST(1) and ST(2) in each NAND string NS may be designed to be any number. The number of string units SU in each block BLK may be designed to be any number.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
    a first stacked body including a first insulating film and a first conductive film alternately stacked in a first direction, the first insulating film including a first material;
    a plurality of first columnar bodies including a first semiconductor portion and extending through the first stacked body in the first direction;
    a second insulating film disposed on the first stacked body and including a second material different from the first material;
    a first insulating portion disposed on the second insulating film; and
    a first film penetrating at least the second insulating film in the first direction and extending in a second direction intersecting the first direction;
    wherein an interface between the first film and the second insulating film has a step profile in a cross section substantially perpendicular to the second direction, and the step profile is between a top surface and a bottom surface of the second insulating film.

2. The semiconductor memory device according to claim 1, wherein the second material includes a dielectric material other than an oxide material.

3. The semiconductor memory device according to claim 1, wherein the second material includes silicon nitride or aluminum oxide.

4. The semiconductor memory device according to claim 1, further comprising a first connecting portion that penetrates the second insulating film in the first direction and is electrically connected to each of the plurality of first columnar bodies.

5. The semiconductor memory device according to claim 1, further comprising a second insulating portion that penetrates the first stacked body and the second insulating film in the first direction, wherein the second insulating film is separated from the second insulating portion.

6. The semiconductor memory device according to claim 5, wherein the second insulating portion extends away from the second insulating film farther than the first film does.

7. The semiconductor memory device according to claim 5, wherein at least some of the plurality of first columnar bodies are disposed between the second insulating portion and the first film along the second direction.

* * * * *